United States Patent
Lee et al.

(10) Patent No.: US 12,048,226 B2
(45) Date of Patent: Jul. 23, 2024

(54) DISPLAY DEVICE AND MOBILE TERMINAL DEVICE INCLUDING THE SAME

(71) Applicant: LG Display Co., Ltd., Seoul (KR)

(72) Inventors: Dong Gun Lee, Paju-si (KR); Joung Mi Choi, Paju-si (KR); Man Hyeop Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 443 days.

(21) Appl. No.: 17/380,827

(22) Filed: Jul. 20, 2021

(65) Prior Publication Data
US 2022/0037430 A1    Feb. 3, 2022

(30) Foreign Application Priority Data
Jul. 30, 2020    (KR) .......................... 10-2020-0095199

(51) Int. Cl.
*H10K 59/60* (2023.01)
*G06V 40/13* (2022.01)
(Continued)

(52) U.S. Cl.
CPC ......... *H10K 59/60* (2023.02); *G06V 40/1318* (2022.01); *H04M 1/0266* (2013.01); *H10K 59/1216* (2023.02); *H10K 59/131* (2023.02); *H10K 59/40* (2023.02); *H04M 2250/22* (2013.01)

(58) Field of Classification Search
CPC .. H10K 59/60; H10K 59/1216; H10K 59/131; H10K 59/40; H10K 59/65; H10K 65/00; G06V 40/1318; H04M 1/0266; H04M 2250/22; G09G 3/3258
See application file for complete search history.

(56) References Cited

U.S. PATENT DOCUMENTS 8,350,835 B2    1/2013    Katoh et al.
8,384,805 B2    2/2013    Kurita et al.
(Continued)

FOREIGN PATENT DOCUMENTS

CN    101359111 A    2/2009
CN    101739953 A    6/2010
(Continued)

OTHER PUBLICATIONS

China National Intellectual Property Administration, Office Action, Chinese Patent Application No. 202110856360.1, Nov. 7, 2023, 20 pages.
(Continued)

*Primary Examiner* — S M Sohel Imtiaz
(74) *Attorney, Agent, or Firm* — Fenwick & West LLP

(57) ABSTRACT

Disclosed herein are a display device and a mobile terminal device including the same, which include a display panel including a screen in which a plurality of display pixels which are sequentially scanned, and a plurality of sensor pixels which are exposed to a light during an exposure time to convert the light into an electric current are disposed. While the display pixels disposed in the first area of the screen are scanned, the sensor pixels are exposed. While the display pixels in the second area of the screen are scanned, sensor data is output from the sensor pixels and then the sensor pixels are initialized.

18 Claims, 29 Drawing Sheets

(51) Int. Cl.
  *H04M 1/02*     (2006.01)
  *H10K 59/121*   (2023.01)
  *H10K 59/131*   (2023.01)
  *H10K 59/40*    (2023.01)

(56) References Cited

U.S. PATENT DOCUMENTS

| | | |
|---|---|---|
| 8,847,935 B2 | 9/2014 | Yamashita et al. |
| 8,933,868 B2 | 1/2015 | Choi |
| 9,001,096 B2 | 4/2015 | Sugita et al. |
| 9,257,495 B2 | 2/2016 | Choi |
| 10,205,900 B2 | 2/2019 | Yang et al. |
| 10,579,848 B2 | 3/2020 | Kim et al. |
| 10,860,125 B2 | 12/2020 | Kim |
| 11,048,901 B2 | 6/2021 | Kim et al. |
| 11,075,250 B2 | 7/2021 | Lee et al. |
| 11,328,670 B2 | 5/2022 | Zhang et al. |
| 11,594,582 B2 | 2/2023 | Han et al. |
| 11,790,687 B2 | 10/2023 | Han et al. |
| 2010/0118003 A1 | 5/2010 | Yamashita et al. |
| 2010/0194794 A1 | 8/2010 | Nose et al. |
| 2011/0109532 A1 | 5/2011 | Choi |
| 2011/0115942 A1 | 5/2011 | Kurita et al. |
| 2011/0175871 A1 | 7/2011 | Katoh et al. |
| 2012/0293475 A1 | 11/2012 | Sugita et al. |
| 2014/0232758 A1 | 8/2014 | Yamashita et al. |
| 2015/0125973 A1 | 5/2015 | Choi |
| 2018/0270430 A1 | 9/2018 | Yang et al. |
| 2018/0285619 A1 | 10/2018 | Kim et al. |
| 2019/0155429 A1 | 5/2019 | Kim |
| 2019/0165056 A1* | 5/2019 | Lee ................. H10K 59/40 |
| 2019/0340409 A1* | 11/2019 | Zhu ................. H10K 59/35 |
| 2019/0393279 A1 | 12/2019 | Lee et al. |
| 2020/0175249 A1 | 6/2020 | Kim et al. |
| 2020/0387684 A1* | 12/2020 | Setlak ............. G06F 3/0421 |
| 2021/0142026 A1* | 5/2021 | Hao ................. G02F 1/13312 |
| 2021/0158751 A1* | 5/2021 | Cha ................. H10K 65/00 |
| 2021/0335249 A1 | 10/2021 | Zhang et al. |
| 2021/0406502 A1* | 12/2021 | You ................. H10K 59/60 |
| 2021/0408140 A1 | 12/2021 | Han et al. |
| 2022/0019757 A1 | 1/2022 | Han et al. |
| 2023/0292579 A1* | 9/2023 | Ren ................. H10K 65/00 257/72 |

FOREIGN PATENT DOCUMENTS

| | | |
|---|---|---|
| CN | 101779299 A | 7/2010 |
| CN | 101828143 A | 9/2010 |
| CN | 102025918 A | 4/2011 |
| CN | 102667905 A | 9/2012 |
| CN | 104267857 A | 1/2015 |
| CN | 105913792 A | 8/2016 |
| CN | 107908310 A | 4/2018 |
| CN | 108154844 A | 6/2018 |
| CN | 108766330 A | 11/2018 |
| CN | 109801578 A | 5/2019 |
| CN | 110649049 A | 1/2020 |
| CN | 113838897 A | 12/2021 |
| CN | 114023265 A | 2/2022 |
| JP | 2003-347533 A | 12/2003 |
| KR | 10-2011-0051610 A | 5/2011 |
| KR | 10-2018-0034779 A | 4/2018 |

OTHER PUBLICATIONS

Korean Intellectual Property Office, Office Action, Korean Patent Application No. 10-2020-0095199, Feb. 27, 2024, 11 pages.

\* cited by examiner

DISPLAY DEVICE AND MOBILE TERMINAL DEVICE INCLUDING THE SAME

CROSS-REFERENCE TO RELATED APPLICATION

This application claims priority to and the benefit of Republic of Korea Patent Application No. 10-2020-0095199, filed on Jul. 30, 2020, the disclosure of which is hereby incorporated by reference in its entirety.

BACKGROUND

1. Technical Field

The present disclosure relates to a display device with a fingerprint sensor and a mobile terminal device including the same.

2. Discussion of Related Art

Electroluminescent display devices are roughly classified into inorganic light emitting display devices and organic light emitting display devices according to materials of light emitting layers. Active matrix type organic light emitting display devices include organic light-emitting diodes (hereinafter referred to as "OLEDs"), which emit light by themselves and have advantages in that response speeds are fast, and light emission efficiencies, brightness, and viewing angles are high. In the organic light-emitting display devices, the OLEDs are formed in pixels. Since organic light-emitting display devices have fast response speed and are excellent in light emission efficiency, brightness, and viewing angle as well as can exhibit a black gradation in a full black color, the organic light-emitting display devices have excellent contrast ratio and color reproducibility.

Recently, the organic light-emitting display devices are being widely applied to display devices of mobile terminal devices. A biometric recognition technique is applied to user authentication of the mobile terminal device. As an example of the biometric recognition technique, since fingerprint sensors provide security and convenience in user authentication processes, the fingerprint sensors are widely applied to smart phones. The fingerprint sensors applied to the smartphones sense fingerprints of users when screen unlocking or user authentication is required.

Due to the fingerprint sensors, there are many restrictions on screen designs of the smartphones. As an example, the existing button-type fingerprint sensor is an obstacle which makes it impossible to enlarge a screen size and implement a full-screen display due to being disposed below a screen of a display device. In order to implement the full-screen display, a fingerprint recognition on display (FOD) technique has been developed to place a fingerprint sensor below the screen of a display panel and sense a fingerprint on the screen. Since a fingerprint sensor module should be located below the screen in order to implement an FOD, a thickness of the display device is increased, and a process of assembling the display panel with the fingerprint sensor module is added so that there is a problem in which yield is decreased and a manufacturing cost is increased.

SUMMARY

The present disclosure is directed to solving all of the above-described necessities and problems.

The present disclosure is directed to a display device in which a sensor pixels are embedded in a display panel so that a process of assembling the display panel with a fingerprint sensor module is not required and which is capable of sufficiently securing and adjusting an exposure time of the sensor pixels, and a mobile terminal device including the same.

It should be noted that objects of the present disclosure are not limited to the above-described objects, and other objects of the present disclosure will be apparent to those skilled in the art from the following descriptions.

According to an aspect of the present disclosure, there is provided a display device including a display panel. The display panel includes a screen in which a plurality of display pixels which are sequentially scanned, and a plurality of sensor pixels which are exposed to a light during an exposure time to convert the light into an electric current are disposed.

The display pixels are disposed in a first and second areas of the screen, and the sensor pixels are disposed in the second area of the screen.

While the display pixels disposed in the first area of the screen are scanned, the sensor pixels are exposed. While the display pixels in the second area of the screen are scanned, sensor data is output from the sensor pixels and then the sensor pixels are initialized.

According to another aspect of the present disclosure, there is provided a mobile terminal device including the display device.

BRIEF DESCRIPTION OF THE DRAWINGS

The above and other objects, features and advantages of the present disclosure will become more apparent to those skilled in the art by describing exemplary embodiments thereof in detail with reference to the accompanying drawings, in which.

DETAILED DESCRIPTION

Figure 1:
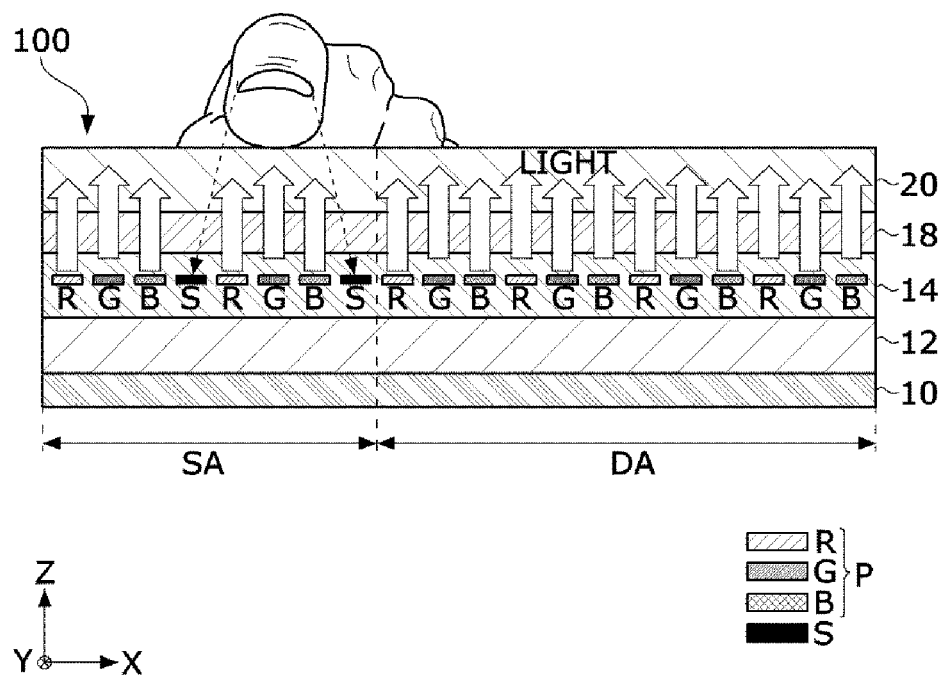
FIG. 1 is schematic diagrams illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Referring to FIG. 1, a screen of a display panel 100 includes a pixel array on which an input image is reproduced. The pixel array includes a display area DA and a sensing area SA.

A first group of display pixels R, G, and B in which pixel data is written is disposed in the display area DA. A second group of display pixels R, G, and B and a plurality of photosensor are disposed in the sensing area SA.

The display area DA includes display pixels R, G, and B disposed in high amount (e.g., a large amount) of pixels per inch (PPI) and displays input data. The input data may be data including pixel data of the input image or various types of information.

The sensing area SA includes display pixels R, G, and B in which the pixel data is written and pixels of an image sensor (hereinafter referred to as "sensor pixels") which sense a fingerprint pattern. Each of the sensor pixels S includes a photosensor which photoelectrically converts light. The sensor pixels S are exposed to a light during an exposure time to convert the light into an electric current. While the display pixels R, G, and B disposed in a first area of the screen are scanned, the sensor pixels S may are exposed. While the display pixels R, G, and B in a second area of the screen are scanned, sensor data may be output from the sensor pixels S and then the sensor pixels S may be initialized.

The sensing area SA displays input data on the display pixels R, G, and B in a display mode and senses a fingerprint using the sensor pixels S in a fingerprint recognition mode. The display pixels R, G, and B and the sensor pixel S of the sensing area SA share most lines and have similar cross-sectional structures. The display pixels R, G, and B may be disposed to be coplanar with the sensor pixels S. In this case, PPI of the display pixels R, G, and B in the sensing area SA may be lower than PPI of the display pixels in the display area DA due to a portion occupied by the sensor pixels S. The display pixels R, G, and B and the sensor pixels S of the sensing area SA may be simultaneously formed in the existing manufacturing process without any additional process.

Since the PPI of the display pixels R, G, and B of the sensing area SA is lower than the PPI of display area DA, an image quality compensation algorithm may be applied to compensate for a brightness and color coordinates of pixel data to be written in the display pixels R, G, and B of the sensing area SA such that there is no difference in image quality of the sensing area SA.

According to the present disclosure, the display pixels R, G, and B are disposed not only in the display area DA, but also in the sensing areas SA. Thus, the display device of the present disclosure may implement a full-screen display.

Each of the display pixels R, G, and B disposed in the display area DA and the sensing areas SA includes sub-pixels of different colors so as to implement a color of an image. The sub-pixels include a red sub-pixel (hereinafter referred to as an "R sub-pixel"), a green sub-pixel (hereinafter referred to as a "G sub-pixel"), a and blue sub-pixel (hereinafter referred to as a "B sub-pixel"). Although not shown in the drawing, each of the pixels P may further include a white sub-pixel (hereinafter referred to as a "W sub-pixel"). Each of the sub-pixels includes a pixel circuit and a light-emitting element. In FIG. 1, R denotes an R sub-pixel, G denotes a G sub-pixel, and B denotes a B sub-pixel.

At least one display pixel among the display pixels R, G, and B of the sensing area SA may be driven as a light source in the fingerprint recognition mode which is executed when a fingerprint recognition event occurs. In the fingerprint recognition mode, when a user places a fingerprint on a cover glass 20 of the sensing area SA, light sources of the sensing area SA are turned on. The photosensor of each of the sensor pixels S in the sensing area SA is driven in the fingerprint recognition mode, converts light, which is reflected from the fingerprint of the user in contact with the cover glass 20, into an electrical signal, and transmits the electrical signal to a fingerprint recognition processor. The fingerprint recognition processor amplifies output signals of the photosensors and converts the output signals into digital data to generate fingerprint pattern data. A host system omitted from FIG. 1 compares the fingerprint pattern data from the fingerprint recognition processor with a previously registered user's fingerprint pattern image and performs fingerprint authentication.

The fingerprint recognition processor may be integrated with a timing controller for controlling an operation timing of a display panel driver.

According to the present disclosure, since a separate fingerprint sensor module is not bonded to the display panel 100, there is no reduction in yield caused due to a process of assembling the display panel 100 with a fingerprint sensor module, and a manufacturing cost may be decreased.

The display panel 100 has a width in an X-axis direction, a length in a Y-axis direction, and a thickness in a Z-axis direction. The display panel 100 includes a circuit layer 12 disposed on a substrate 10, and a light-emitting element and sensor layer 14 disposed on the circuit layer 12. A polarizing plate 18 may be disposed on the light-emitting element and sensor layer 14, and the cover glass 20 may be disposed on the polarizing plate 18.

The circuit layer 12 may include pixel circuits connected to data lines, gate lines, and power lines, gate drivers for driving the gate lines, and photosensor drive circuits. The circuit layer 12 may include circuit elements such as a transistor implemented as a thin film transistor (TFT) and a capacitor.

The light-emitting element and sensor layer 14 may include a light-emitting element which is driven by the pixel circuit. The light-emitting element may be implemented as an organic light emitting diode (OLED). The OLED includes an organic compound layer formed between an anode electrode and a cathode electrode. The organic compound layer may include a hole injection layer HIL, a hole transport layer HTL, a light emission layer EML, an electron transport layer ETL, and an electron injection layer EIL, but the present disclosure is not limited thereto. When a voltage is applied to an anode electrode and a cathode electrode of the OLED, holes passing through the hole transport layer HTL and electrons passing through the electron transport layer ETL move to the light emission layer EML to form excitons so that visible light is emitted from the light emission layer EML. The light-emitting element and sensor layer 14 may further include a color filter which is disposed on the circuit layer 12 and selectively transmits red, green, and blue wavelengths.

The light-emitting element and sensor layer 14 include the photo sensors formed on the same layer as the light-emitting elements. The photo sensor may be implemented as a photodiode.

The light-emitting element and the sensor layer 14 may be covered with a protective film, and the protective film may be covered with an encapsulation layer. The protective layer and the encapsulation layer may have a structure in which an organic layer and an inorganic layer are alternately stacked. The inorganic layer blocks infiltration of moisture or oxygen. The organic film planarizes a surface of the inorganic layer. When the organic layer and the inorganic layer are stacked in multiple layers, a movement path of moisture or oxygen becomes longer than a movement path of a single layer so that the infiltration of moisture/oxygen affecting the light-emitting element and sensor layer 14 may be effectively blocked.

The polarizing plate 18 may be bonded to the encapsulation layer. The polarizing plate 18 improves outdoor visibility of the display device. The polarizing plate 18 reduces light reflected from a surface of the display panel 100 and blocks light reflected from a metal of the circuit layer 12, thereby improving brightness of the pixels. The polarizing plate 18 may be implemented as a polarizing plate or a circular polarizing plate to which a linear polarizing plate and a phase delay film are bonded.

Figure 2:
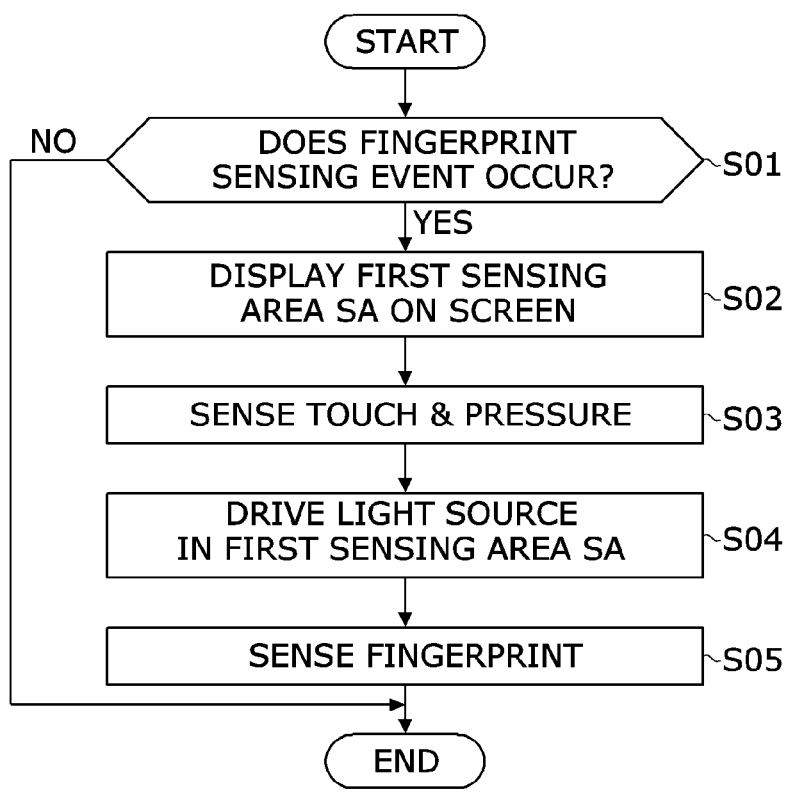
FIG. 2 is a flowchart illustrating a method of driving a first sensing area in a fingerprint recognition mode according to an embodiment of the present disclosure.

FIG. 2 is a flowchart illustrating a method of driving the sensing area SA in the fingerprint recognition mode according to an embodiment of the present disclosure.

Referring to FIG. 2, when a fingerprint sensing event occurs, the sensing area SA starts to be operated in the fingerprint recognition mode. A host system is connected to the display device, receives the fingerprint pattern image data from the fingerprint recognition processor in an application which requires user authentication, and processes fingerprint authentication.

Figure 3:
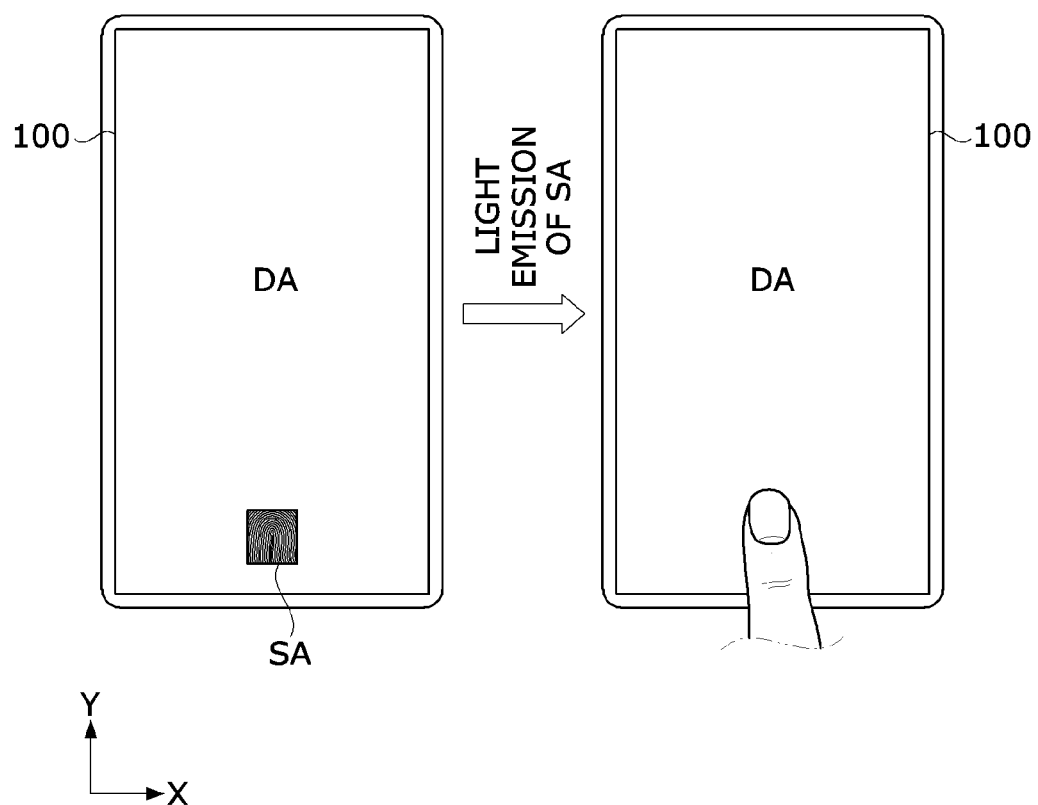
FIG. 3 is a diagram illustrating an example in which a fingerprint is sensed on a screen.

As shown in FIG. 3, when the fingerprint recognition mode starts, the display device may display the sensing area SA on the screen to guide a fingerprint sensing position (S01 and S02). In response to an output signal from a touch sensor or a pressure sensor, the host system detects a finger placed in the sensing area SA (S03). In response to a command from the host system, the fingerprint recognition processor drives the light sources and the sensor pixels S in the sensing area SA to sense a fingerprint (S04 and S05). The sensor pixels S photoelectrically convert light reflected from the fingerprint of the user in the fingerprint recognition mode. The fingerprint recognition processor converts output signals of the sensor pixels S into digital data to generate fingerprint pattern image data and transmits the fingerprint pattern image data to the host system.

Figure 4:
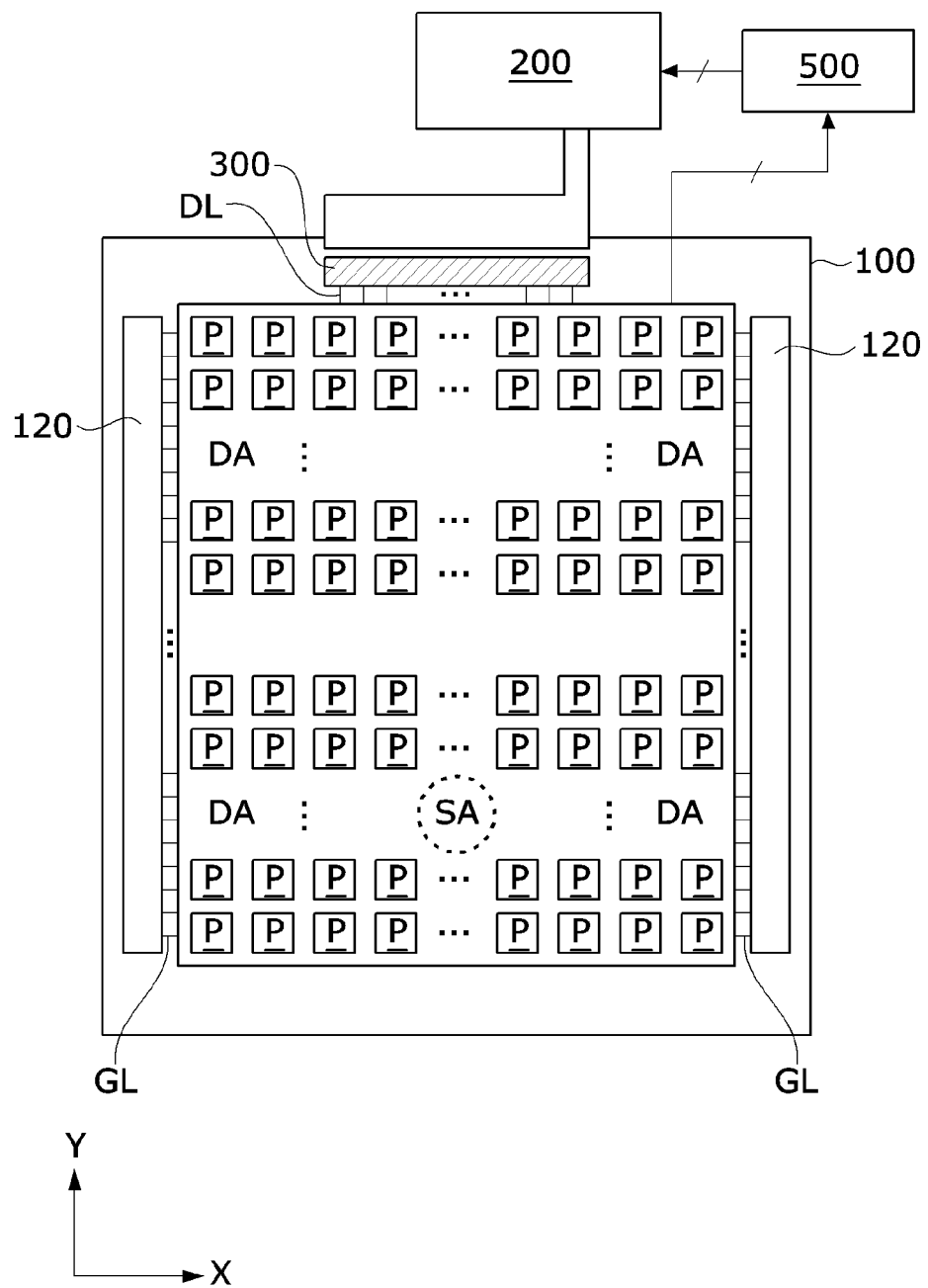
FIG. 4 is a block diagram illustrating a display panel and a display panel driver according to an embodiment of the present disclosure.
Figure 5:
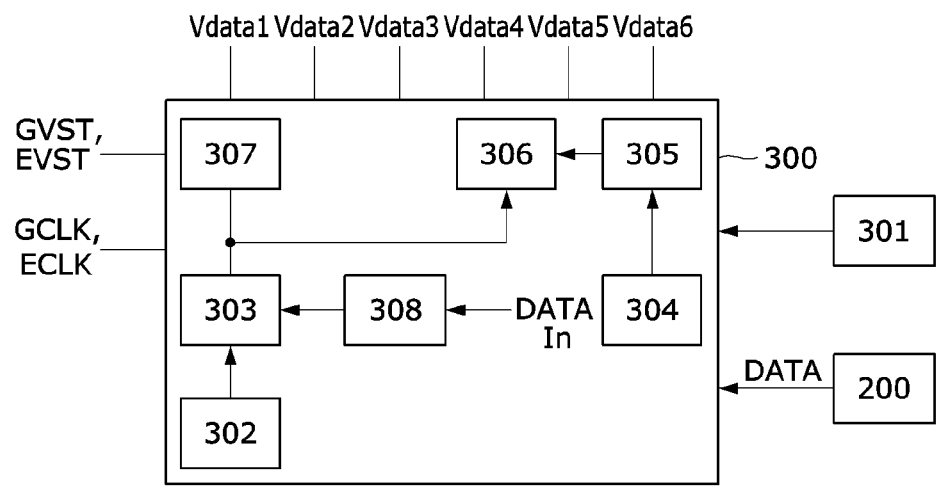
FIG. 5 is a schematic block diagram illustrating a configuration of a drive integrated circuit (IC) according to an embodiment of the present disclosure.

FIGS. 4 and 5 are diagrams illustrating the display device according to the embodiment of the present disclosure.

Referring to FIGS. 4 and 5, the display device includes the display panel 100 in which the pixel array is disposed on the screen, and the display panel driver.

Figure 6:
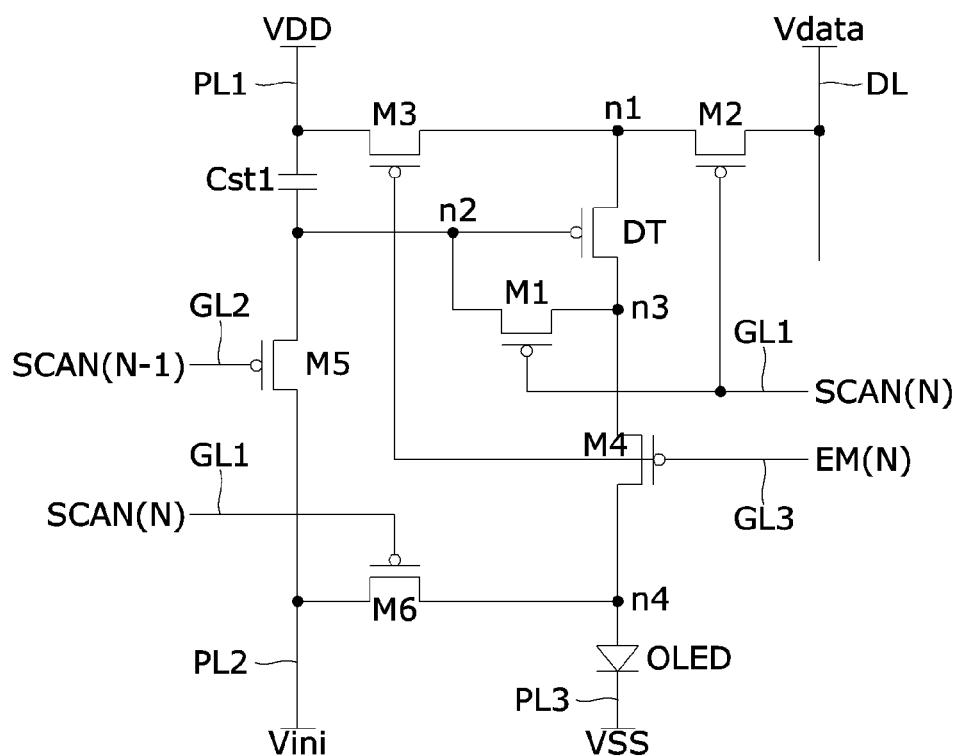
FIG. 6 is a circuit diagram illustrating an example of a pixel circuit according to an embodiment of the present disclosure.
Figure 7:
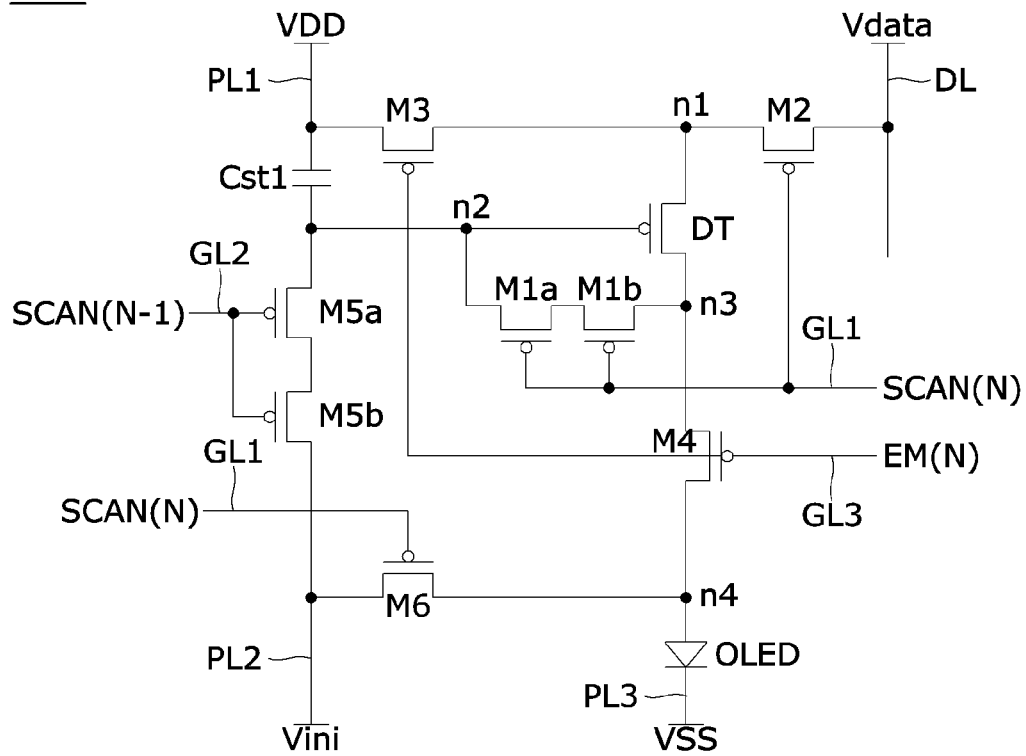
FIG. 7 is a circuit diagram illustrating another example of the pixel circuit according to an embodiment of the present disclosure.

The pixel array of the display panel 100 includes data lines DL, gate lines GL intersecting the data lines DL, and display pixels P disposed in the form of a matrix defined by the data lines DL and the gate lines GL. The pixel array further includes power lines such as a VDD line PL1, a Vini line PL2, and a VSS line PL3 which are shown in FIGS. 6 and 7. The pixel array includes the display area DA and the sensing areas SA, which display an input image in the display mode together. The sensing area SA senses a fingerprint pattern of the user in the fingerprint recognition mode.

As shown in FIG. 1, the pixel array may be divided into the circuit layer 12 and the light-emitting element and sensor layer 14. A touch sensor array may be disposed above the light-emitting element and sensor layer 14.

In the display panel 100, the screen on which an input image is reproduced includes the display area DA and the sensing area SA.

In the display area DA and the sensing area SA, each of the sub-pixels of the display pixel includes a pixel circuit. The pixel circuit may include a driving element which supplies a current to a light-emitting element OLED, a plurality of switching elements for sampling a threshold voltage of the driving element and switching a current path of the pixel circuit, and a capacitor which maintains a gate voltage of the driving element. Each of the sensor pixels S in the sensing area SA includes a photodiode and a photosensor drive circuit for driving the photodiode.

The sensing area SA includes pixels in which pixel data is written, and the sensor pixels S spaced a predetermined interval from each other with the pixels interposed therebetween. The sensor pixels S includes photosensors and a photosensor drive circuit for driving the photosensors. The display pixels in the sensing area SA emit light according to a data voltage of the pixel data in the display mode to display input data, whereas the display pixels emit light at a high brightness according to a voltage of light source driving data in the fingerprint recognition mode and are driven as light sources. The light source driving data is data irrelevant to the pixel data of the input image.

Figure 9:
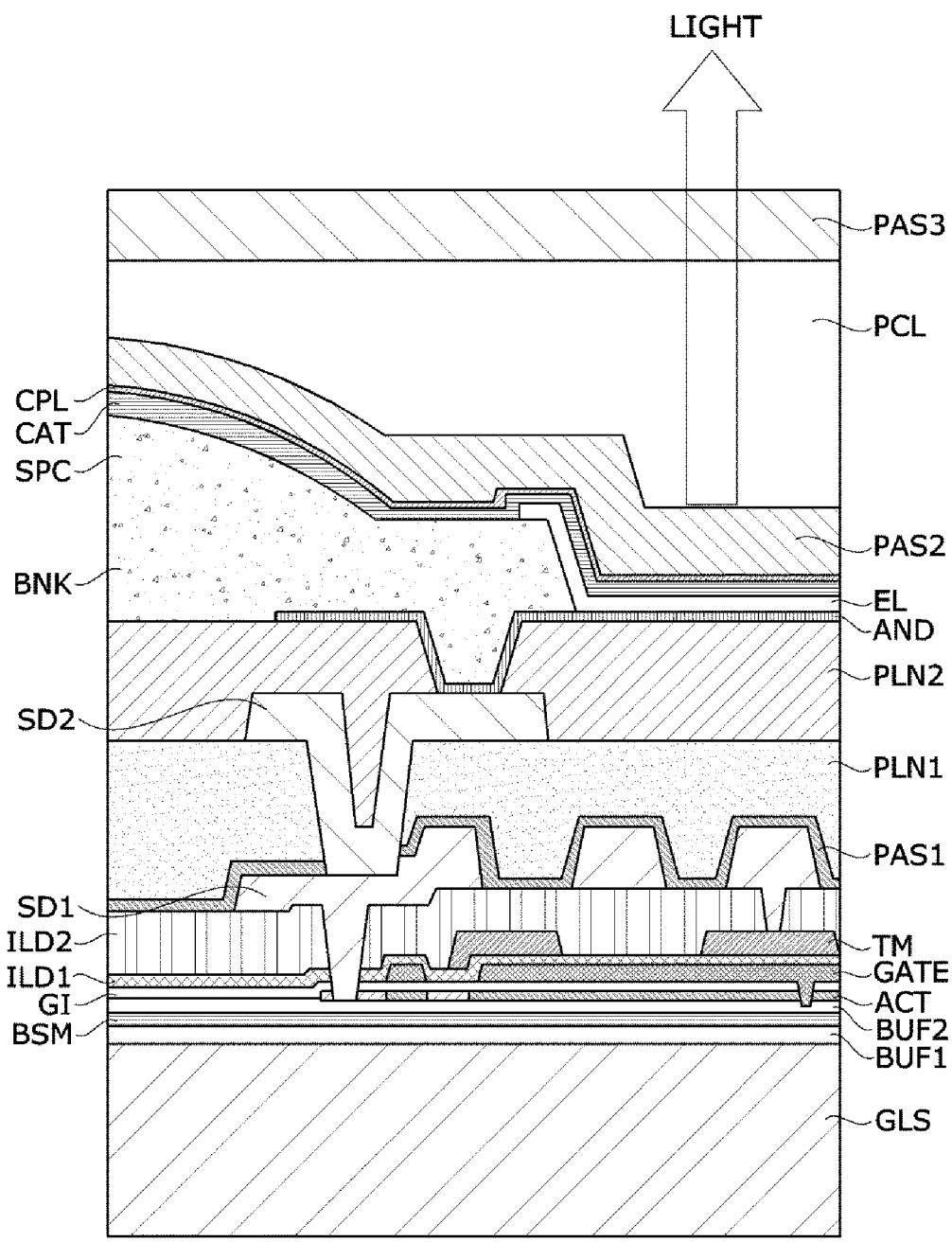
FIG. 9 is a detailed cross-sectional view illustrating a cross-sectional structure of the display panel according to one embodiment of the present disclosure.
Figure 10:
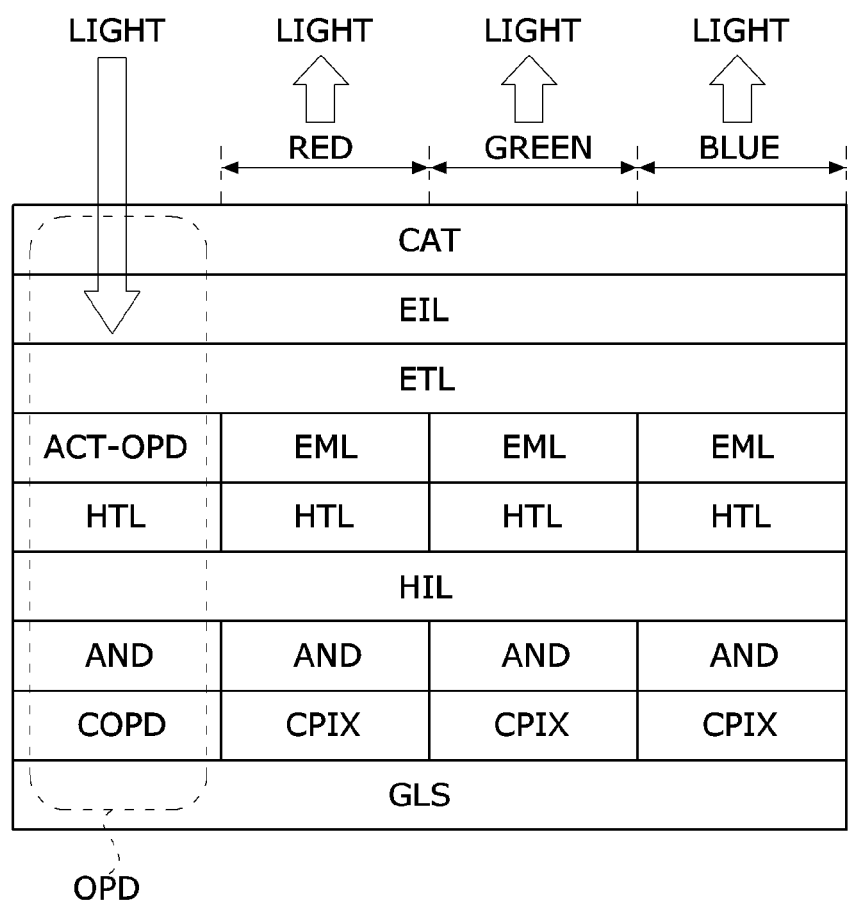
FIG. 10 is a diagram illustrating cross-sectional structures of an organic photodiode of a sensor pixel and a light-emitting element of a display pixel according to one embodiment of the present disclosure.

As shown in FIGS. 9 and 10, the pixel circuit and the photosensor drive circuit may be disposed below the light-emitting element OLED.

The display panel driver writes the pixel data of the input image in the display pixels P. The display panel driver includes a data driver 306 which supplies a data voltage of pixel data to the data lines DL, and a gate driver 120 which sequentially supplies a gate pulse to the gate lines GL. The data driver 306 may be integrated in a drive IC 300. The display panel driver may further include a touch sensor driver which is omitted from the drawings. The data driver 306 may be integrated in the drive IC 300 together with a timing controller 303.

The drive IC 300 may include a data receiving and calculating part 308, the timing controller 303, the data driver 306, a gamma compensation voltage generator 305, a power supply 304, and a second memory 302. The drive IC 300 may be connected to the host system 200, a first memory 301, and the display panel 100.

The drive IC 300 may be bonded to the display panel 100. The drive IC 300 receives a pixel data and a timing signal of an input image from a host system 200, supplies a data voltage of the pixel data to the display pixels through the data lines DL and synchronizes the data driver 306 with the gate driver 120.

The drive IC 300 is connected to the data lines DL through data output channels to supply the data voltage of the pixel data to the data lines DL. The drive IC 300 may output a gate timing signal for controlling the gate driver 120 through gate timing signal output channels. The gate timing signal generated from the timing controller 303 may include a gate start pulse GVST and a gate shift clock GCLK. The gate start pulse GVST and the gate shift clock GCLK swing between a gate-on voltage VGL and a gate-off voltage VGH. The gate timing signals GVST and GCLK output from a level shifter 307 are applied to the gate driver 120 to control a shift operation of the gate driver 120.

The gate driver 120 may include a shift register formed in the circuit layer 12 of the display panel 100 together with the pixel array. The shift register of the gate driver 120 sequentially supplies a gate signal to the gate lines GL under the control of the timing controller 303. The gate signal includes a scan pulse and a light emission pulse (EM pulse) which are applied to the pixel circuit, and an exposure signal TG applied to the photosensor drive circuit The shift register may include a scan driver which outputs a scan pulse and an EM driver which outputs an EM pulse. In FIG. 5, GVST and GCLK are gate timing signals input to the scan driver. EVST and ECLK are gate timing signals input to the EM driver.

The data receiving and calculating part 308 includes a receiver for receiving pixel data which is input as a digital signal from the host system 200, and a data calculator for processing the pixel data input through the receiver to improve image quality. The data calculator may include a data restoration part for decoding and restoring compressed pixel data, and an optical compensator for adding a predetermined optical compensation value to the pixel data. The optical compensation value may be set as a value for compensating a luminance of each pixel data based on a luminance of the screen measured based on an image captured by a camera in the manufacturing process.

The timing controller 303 provides the data driver 306 with pixel data of an input image received from the host system 200. The timing controller 303 generates a gate timing signal for controlling the gate driver 120 and a source timing signal for controlling the data driver 306 to control operation timings of the gate driver 120 and the data driver 306.

The data driver 306 converts the pixel data (digital data) received from the timing controller 303 through a digital-to-analog converter (DAC) into a gamma compensation voltage and outputs a data voltage Vdata1~Vdata6. The data voltage output from the data driver 306 is supplied to the data lines DL of the pixel array through an output buffer connected to data channels of the drive IC 300.

The gamma compensation voltage generator 305 divides a gamma reference voltage from the power supply 304 through a voltage divider circuit to generate a gamma compensation voltage for each gradation. The gamma compensation voltage is an analog voltage in which a voltage is set for each gradation of the pixel data. The gamma compensation voltage output from the gamma compensation voltage generator 305 is provided to the data driver 306.

The power supply 304 generates power required for driving the pixel array of the display panel 100, the gate driver 120, and the drive IC 300 using a direct current (DC)-DC converter. The DC-DC converter may include a charge pump, a regulator, a buck converter, and a boost converter. The power supply 304 may adjust a DC input voltage from the host system 200 to generate DC power such as a gamma reference voltage, the gate on voltage VGL, the gate-off voltage VGH, a pixel driving voltage VDD, a low potential power voltage VSS, and an initialization voltage Vini. The gamma reference voltage is supplied to the gamma compensation voltage generator 305. The gate-on voltage VGL and the gate-off voltage VGH are supplied to the level shifter 307 and the gate driver 120. Pixel power, such as the pixel driving voltage VDD, the low potential power voltage VSS, and the initialization voltage Vini, is commonly supplied to the pixels P. The pixel driving voltage VDD is set to a voltage that is higher than the low potential power voltage VSS. The initialization voltage Vini is set to a DC voltage that is lower than a threshold voltage of the light-emitting element OLED to initialize main nodes of the pixel circuits and suppress the light-emitting element OLED from emitting light. The initialization voltage Vini may be set to a voltage that is lower than the pixel driving voltage VDD and is less than or equal to the low potential power voltage VSS.

When power is supplied to the drive IC 300, a second memory 302 stores a compensation value, resistor setting data, and the like which are received from a first memory 301. The compensation value may be applied to various algorithms for improving image quality. The compensation value may include an optical compensation value. The resistor setting data may set in advance so as to control operations of the data driver 306, the timing controller 303, and the gamma compensation voltage generator 305. The first memory 301 may include a flash memory. The second memory 302 may include a static random access memory (SRAM).

The host system 200 may be implemented as an application processor (AP). The host system 200 may transmit pixel data of an input image to the drive IC 300 through a mobile industry processor interface (MIPI). For example, the host system 200 may be connected to the drive IC 300 through a flexible printed circuit (FPC).

The present disclosure further includes a fingerprint recognition processor 500. The fingerprint recognition processor 500 is connected to the sensor pixels S in the first sensing area SA. The fingerprint recognition processor 500 amplifies output voltages of the sensor pixels S and converts the output voltages using an analog-to-digital converter (ADC) into digital data to generate fingerprint pattern image data. The host system 200 receives the fingerprint pattern data from the fingerprint recognition processor 500 in the fingerprint recognition mode and processes fingerprint authentication on the basis of the result of comparing the fingerprint pattern data with the registered fingerprint image.

The display panel 100 may be implemented as a flexible panel applicable to a flexible display. A screen size of the flexible display may be varied by winding, folding, and bending a flexible display panel, and the flexible display may be easily manufactured in various designs. The flexible display may be implemented as a rollable display, a foldable display, a bendable display, a slidable display, or the like. The flexible panel may be made of a "plastic OLED panel." The plastic OLED panel may include a back plate and a pixel array on an organic thin film bonded to the back plate. A touch sensor array may be formed on the pixel array.

The back plate may be a polyethylene terephthalate (PET) substrate. A pixel array and a touch sensor array may be formed on an organic thin film substrate. In order to prevent or at least reduce the pixel array from being exposed to humidity, the back plate may block moisture permeation toward the organic thin film. The organic thin film substrate may be a polyimide (PI) film substrate. A multilayer buffer film may be formed of an insulating material (not shown) on the organic thin film substrate. The circuit layer 12 and the light-emitting element and sensor layer 14 may be stacked on the organic thin film substrate.

In the display device of the present disclosure, the pixel circuit, the photosensor drive circuit, and the gate driver 120, which are disposed in the circuit layer 12, may include a plurality of transistors. The transistors may be implemented as oxide TFTs including oxide semiconductors, low temperature poly silicon (LTPS) TFTs including LTPSs, or the like. Each of the transistors may be implemented as a p-channel TFT or an n-channel TFT. In the embodiment, the transistors of the pixel circuit are mainly described as an example implemented as p-channel TFTs, but the present disclosure is not limited thereto.

The transistor is a three-electrode element including a gate, a source, and a drain. The source is an electrode for supplying a carrier to the transistor. In the transistor, the carriers begin to flow from the source. The drain is an electrode in which the carrier is discharged from the transistor to the outside. In the transistor, the carrier flows from the source to the drain. In the case of an n-channel transistor, since the carrier is an electron, a source voltage is lower than a drain voltage so as to allow electrons to flow from the source to the drain. In the n-channel transistor, a current flows in a direction from the drain to the source. In the case of a p-channel transistor (a p-type metal oxide semiconductor (PMOS)), since the carrier is a hole, the source voltage is higher than the drain voltage so as to allow holes to flow from the source to the drain. In the p-channel transistor, since the holes flow from the source to the drain, a current flows from the source to the drain. It should be noted that the source and the drain of the transistor are not fixed. For example, the source and the drain may be changed according to an applied voltage. Therefore, the present disclosure is not limited due to the source and the drain of the transistor. In the following description, the source and the drain of the transistor will be referred to as a first electrode and a second electrode, respectively.

A gate pulse swings between a gate-on voltage and a gate-off voltage. The gate-on voltage is set to a voltage that is higher than a threshold voltage of the transistor, and the gate-off voltage is set to a voltage that is lower than the threshold voltage of the transistor. The transistor is turned on in response to the gate-on voltage, whereas the transistor is turned off in response to the gate-off voltage. In the case of the n-channel transistor, the gate-on voltage may be a gate high voltage VGH, and the gate-off voltage may be a gate low voltage VGL. In the case of the p-channel transistor, the gate-on voltage may be the gate low voltage VGL, and the gate-off voltage may be the gate high voltage VGH.

A driving element of the pixel circuit may be implemented as a transistor. The driving element should have a uniform electrical characteristic in all the pixels. However, there may be a difference between the pixels due to a process deviation and an element characteristic deviation, and an electrical characteristic may be varied with the passage of driving time of a display. In order to compensate for an electrical characteristic deviation of the driving element, the display device may include an internal compensation circuit and an external compensation circuit. The internal compensation circuit is added to the pixel circuit in each of the sub-pixels to sample a threshold voltage Vth and/or mobility $\mu$ of the driving element, which are varied according to the electrical characteristic of the driving element, and compensate for a variation in real time. The external compensation circuit transmits the threshold voltage Vth and/or the mobility μ of the driving element, which are sensed through sensing lines connected to the sub-pixels, to an external compensator. A compensator of the external compensation circuit compensates for a variation in electrical characteristic of the driving element by reflecting the sensed result and modulating the pixel data of the input image. The external compensation circuit senses a voltage of the pixel, which is varied according to the electrical characteristic of the driving element, and modulates the data of the input image in an external circuit on the basis of the sensed voltage, thereby compensating for the electrical characteristic deviation of the driving element between the pixels.

Figure 8:
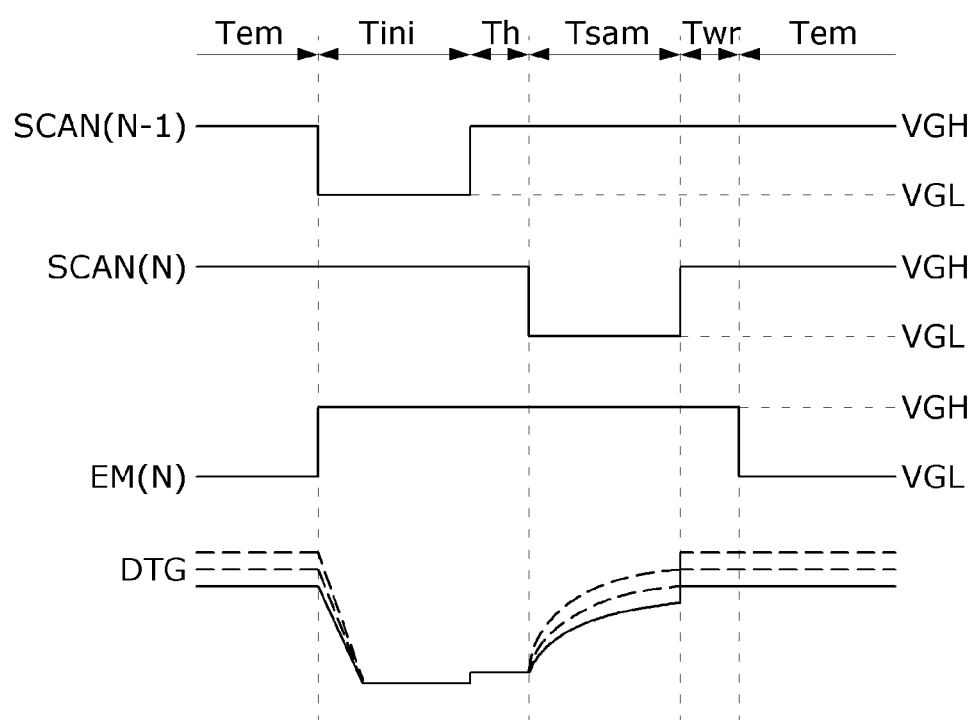
FIG. 8 is a waveform diagram illustrating a method of driving the pixel circuits shown in FIGS. 6 and 7 according to an embodiment of the present disclosure.

FIGS. 6 and 7 are circuit diagrams illustrating an example of a pixel circuit to which an internal compensation circuit is applied according to one embodiment. FIG. 8 is a waveform diagram illustrating a method of driving the pixel circuits shown in FIGS. 6 and 7 according to one embodiment. The pixel circuits shown in FIGS. 6 and 7 may be equally applied to the display pixels in the display area DA and the first sensing area SA. The pixel circuits shown in FIGS. 6 and 7 are an example of a pixel circuit applicable to the present disclosure, and the present disclosure is not limited thereto.

Referring to FIGS. 6 to 8, the pixel circuit includes a light-emitting element OLED, a driving element DT which supplies a current to the light-emitting element OLED, and a switching circuit for switching voltage applied to the electrodes of the driving element DT in response to the scan pulses SCAN(N−1) SCAN(N) and an EM pulse EM(N).

The switching circuit is connected to the power lines PL1, PL2, and PL3, to which the pixel driving voltage VDD, the low potential power voltage VSS, and the initialization voltage Vini are applied, the data line DL, and gate lines GL1, GL2, GL3 and switch the voltages applied to the light-emitting element OLED and the driving element DT in response to scan pulses SCAN(N−1) and SCAN(N)] and the EM pulse EM(N).

The switching circuit samples the threshold voltage Vth of the driving element DT using a plurality of switching elements M1 to M6, stores the sampled threshold voltage Vth in a capacitor Cst1, and includes an internal compensation circuit for compensating for the gate voltage of the driving element DT by as much as the threshold voltage Vth of the driving element DT. Each of the driving element DT and the switching elements M1 to M6 may be implemented as a p-channel TFT.

As shown in FIG. 8, a driving period of the pixel circuit may be divided into an initialization period Tini, a sampling period Tsam, a data writing period Twr, and a light emission period Tem.

An $N^{th}$ scan pulse SCAN(N) is generated as the gate-on voltage VGL during the sampling period Tsam and then applied to a first gate line GL1. A $(N-1)^{th}$ scan pulse SCAN(N−1) is generated as a gate-on voltage VGL during the initialization period Tini prior to the sampling period Tsam and then applied to a second gate line GL2. The EM pulse EM(N) is generated as a gate-off voltage VGH during the initialization period Tini and the sampling period Tsam and then applied to a third gate line GL3. The EM pulse EM(N) may be generated as the gate-off voltage VGH during the data writing period Twr.

During the initialization period Tini, the $(N-1)^{th}$ scan pulse SCAN(N−1) is generated as the gate-on voltage VGL, and a voltage of each of the $N^{th}$ scan pulse SCAN(N) and the EM pulse EM(N) is the gate-off voltage VGH. During the sampling period Tsam, the $N^{th}$ scan pulse SCAN(N) is generated as a pulse of the gate-on voltage VGL, and a voltage of each of the $(N-1)^{th}$ scan pulse SCAN(N−1) and the EM pulse EM(N) is the gate-off voltage VGH. During the data writing period Twr, a voltage of each of the $(N-1)^{th}$ scan pulse SCAN(N−1), the $N^{th}$ scan pulse SCAN(N), and the EM pulse EM(N) is the gate-off voltage VGH. During at least a part of the light emission period Tem, the EM pulse EM(N) is generated as the gate-on voltage VGL, and a voltage of each of the $(N-1)^{th}$ scan pulse SCAN(N−1) and the $N^{th}$ scan pulse SCAN(N) is generated as the gate-off voltage VGH.

During the initialization period Tini, a fifth switching element M5 is turned on according to the gate-on voltage VGL of the (N−1)th scan pulse SCAN(N−1), thereby initializing the pixel circuit. During the sampling period Tsam, first and second switching elements M1 and M2 are turned on according to the gate-on voltage VGL of the Nth scan pulse SCAN(N) so that a data voltage Vdata compensated for by as much as the threshold voltage Vth of the driving element DT is stored in the capacitor Cst1. Simultaneously, a sixth switching element M6 is turned on during the sampling period Tsam to lower a voltage of a fourth node n4 to a reference voltage Vref, thereby suppressing the light-emitting element OLED from emitting light. During the data writing period Twr, the first to sixth switching elements M1 to M6 are maintained in an OFF state.

During the light emission period Tem, the third and fourth switching elements M3 and M4 are turned on so that the light-emitting element OLED emits light. During the light emission period Tem, in order to accurately express a brightness of low gradation, a voltage level of the EM pulse EM(N) may be reversed at a predetermined duty ratio between the gate-on low voltage VGL and the gate-off voltage VGH. In this case, the third and fourth switching elements M3 and M4 may repeatedly turn on and off according to a duty ratio of the EM pulse EM(N) during the light emission period Tem.

The light-emitting element OLED may be implemented as an organic light-emitting diode or an inorganic light-emitting diode. Hereinafter, an example in which the light-emitting element OLED is implemented as an organic light-emitting diode will be described.

The anode electrode of the light-emitting element OLED is connected to a fourth node n4 between the fourth and sixth switching elements M4 and M6. The fourth node n4 is connected to the anode of the light-emitting element OLED, a second electrode of the fourth switching element M4, and a second electrode of the sixth switching element M6. The cathode electrode of the light-emitting element OLED is connected to a VSS line PL3 to which a low potential power voltage VSS is applied. The light emitting element OLED emits light with a current Ids which flows according to a gate-source voltage Vgs of the drive element DT. A current path of the light-emitting element OLED is switched by the third and fourth switching elements M3 and M4.

The capacitor Cst1 is connected between the VDD line PL1 and the first node n1. The data voltage Vdata, which is compensated for by as much as the threshold voltage Vth of the driving element DT, is charged at the capacitor Cst. Since the data voltage Vdata in each sub-pixel is compensated for by as much as the threshold voltage Vth of the driving element DT, a characteristic deviation of the driving element DT in each sub-pixel is compensated for.

The first switching element M1 is turned on in response to the gate-on voltage VGL of the $N^{th}$ scan pulse SCAN(N) to connect a second node n2 to a third node n3. The second node n2 is connected to a gate electrode of the driving element DT, a first electrode of the capacitor Cst, and a first electrode of the first switching element M1. The third node n3 is connected to a second electrode of the driving element DT, a second electrode of the first switching element M1, and a first electrode of the fourth switching element M4. A gate electrode of the first switching element M1 is connected to the first gate line GL1 to receive the $N^{th}$ scan pulse SCAN(N). The first electrode of the first switching element M1 is connected to the second node n2, and the second electrode thereof is connected to the third node n3.

Figure 11:
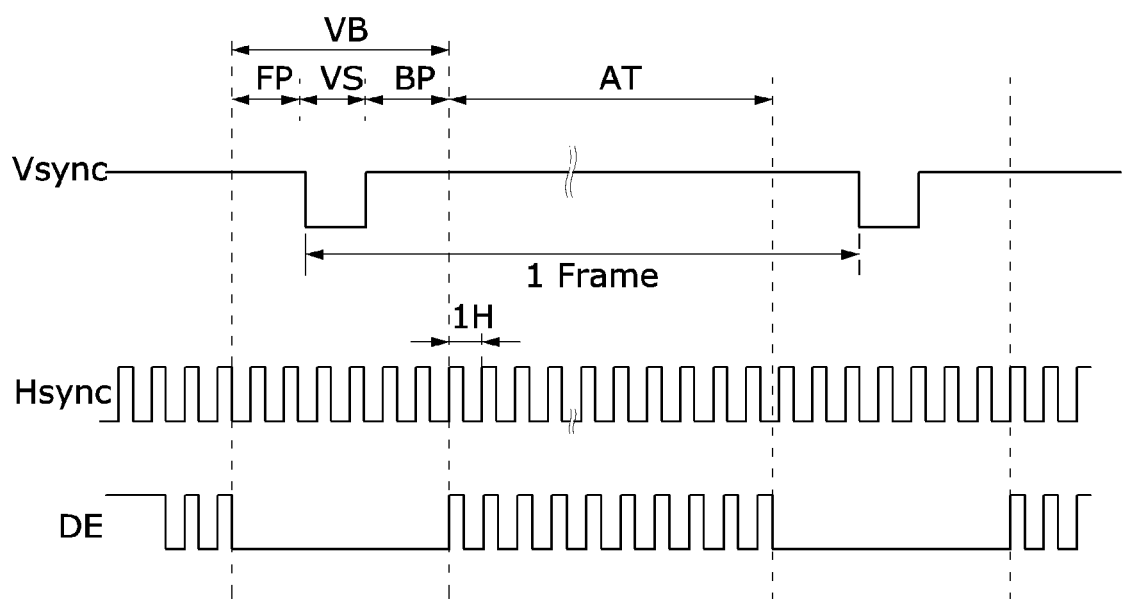
FIG. 11 is a detailed diagram illustrating an active interval and a vertical blank period of one frame period according to an embodiment of the present disclosure.

Since the first switching element M1 is turned on during only a very short one horizontal period 1H of FIG. 11 in which the $N^{th}$ scan pulse SCAN(N) is generated as the gate-on voltage VGL in one frame period and thus is maintained in an OFF state during about one frame period, an OFF current may occur in an OFF state of the first switching element M1. In order to suppress the OFF current of the first switching element M1, as shown in FIG. 7, the first switching element M1 may be implemented as a transistor having a dual gate structure in which two transistors M1a and M1b are connected in series.

The second switching element M2 is turned on in response to the gate-on voltage VGL of the $N^{th}$ scan pulse SCAN(N) to supply the data voltage Vdata to the first node n1. A gate electrode of the second switching element M2 is connected to the first gate line GL1 to receive the $N^{th}$ scan pulse SCAN(N). The first electrode of the second switching element M2 is connected to the first node n1. The second electrode of the second switching element M2 is connected to a data line DL to which the data voltage Vdata is applied. The first node n1 is connected to the first electrode of the second switching element M2, a second electrode of the third switching element M3, and the first electrode of the driving element DT.

The third switching element M3 is turned on in response to the gate-on voltage VGL of the EM pulse EM(N) to connect the VDD line PL1 to the first node n1. A gate electrode of the third switching element M3 is connected to the third gate line GL3 to receive the EM pulse EM(N). A first electrode of the third switching element M3 is connected to the VDD line PL1. The second electrode of the third switching element M3 is connected to the first node n1.

The fourth switching element M4 is turned on in response to the gate-on voltage VGL of the EM pulse EM(N) to connect the third node n3 to the anode electrode of the light-emitting element OLED. A gate electrode of the fourth switching element M4 is connected to the third gate line GL3 to receive the EM pulse EM(N). The first electrode of the fourth switching element M4 is connected to the third node n3, and the second electrode thereof is connected to the fourth node n4.

The fifth switching element M5 is turned on in response to the gate-on voltage VGL of the $(N-1)^{th}$ scan pulse SCAN(N-1) to connect the second node n2 to the Vini line PL2. A gate electrode of the fifth switching element M5 is connected to the second gate line GL2 to receive the $(N-1)^{th}$ scan pulse SCAN(N-1). A first electrode of the fifth switching element M5 is connected to the second node n2, and a second electrode thereof is connected to the Vini line PL2. In order to suppress an OFF current of the fifth switching element M5, as shown in FIG. 7, the first switching element M5 may be implemented as a transistor having a dual gate structure in which two transistors M5a and M5b are connected in series.

The sixth switching element M6 is turned on in response to the gate-on voltage VGL of the $N^{th}$ scan pulse SCAN(N) to connect the Vini line PL2 to the fourth node n4. A gate electrode of the sixth switching element M6 is connected to the first gate line GL1 to receive the $N^{th}$ scan pulse SCAN(N). A first electrode of the sixth switching element M6 is connected to the Vini line PL2, and a second electrode thereof is connected to the fourth node n4.

Meanwhile, the gate electrodes of the fifth and sixth switching elements M5 and M6 may be commonly connected to the second gate line GL2 to which the $(N-1)^{th}$ scan pulse SCAN(N-1) is applied. In this case, the fifth and sixth switching elements M5 and M6 may be simultaneously turned on in response to the $(N-1)^{th}$ scan pulse SCAN(N-1).

The driving element DT controls the current Ids flowing in the light-emitting element OLED according to the gate-source voltage Vgs, thereby driving the light-emitting element OLED. The driving element DT includes a gate connected to the second node n2, the first electrode connected to the first node n1, and the second electrode connected to the third node n3.

During the initialization period Tini, the $(N-1)^{th}$ scan pulse SCAN(N-1) is generated as the gate-on voltage VGL. During the initialization period Tini, each of the $N^{th}$ scan pulse SCAN(N) and the EM pulse EM(N) holds the gate-off voltage VGH. Thus, during the initialization period Tini, the fifth switching element M5 is turned on so that the second and fourth nodes n2 and n4 are initialized at the initialization voltage Vini. A hold period Th may be set between the initialization period Tini and the sampling period Tsam. In the hold period Th, a voltage of each of the scan pulses SCAN(N-1) and SCAN(N) and the EM pulse EM(N) may be the gate-off voltage VGH.

During the sampling period Tsam, the $N^{th}$ scan pulse SCAN(N) is generated as the gate-on voltage VGL. A pulse of the $N^{th}$ scan pulse SCAN(N) is synchronized with a data voltage Vdata of an $N^{th}$ pixel line. During the sampling period Tsam, each of the $(N-1)^{th}$ scan pulse SCAN (N-1) and the EM pulse EM(N) holds the gate-off voltage VGH. Therefore, during the sampling period Tsam, the first and second switching elements M1 and M2 are turned on.

During the sampling period Tsam, a gate voltage DTG of the driving element DT rises due to a current flowing through the first and second switching elements M1 and M2. When the driving element DT is turned off, the gate node voltage DTG becomes Vdata−|Vth|. In this case, a voltage of the first node n1 also becomes Vdata−|Vth|. During the sampling period Tsam, the gate-source voltage Vgs of the drive element DT is |Vgs|=Vdata−(Vdata−|Vth|)=|Vth|.

During the data writing period Twr, the $N^{th}$ scan pulse SCAN(N) is reversed to the gate-off voltage VGH. During the data writing period Twr, each of the $(N-1)^{th}$ scan pulse SCAN (N-1) and the EM pulse EM(N) holds the gate-off voltage VGH. Therefore, during the data writing period Twr, all the switching elements M1 to M6 are maintained in the OFF state.

During the light emission period Tem, the EM pulse EM(N) may be generated as the gate-off voltage VGH. During the light emission period Tem, the voltage of the EM pulse EM(N) may be reversed at a predetermined duty ratio. Thus, the EM pulse EM(N) may be generated as the gate-on voltage VGL during at least a partial period of the light emission period Tem.

When the EM pulse EM(N) is the gate-on voltage VGL, a current flows between a VDD and the light-emitting element OLED so that the light-emitting element OLED may emit light. During the light emission period Tem, the $(N-1)^{th}$ scan pulse SCAN(N-1) and the $N^{th}$ scan pulse SCAN(N) hold the gate-off voltage VGH. During the light emission period Tem, the third and fourth switching elements M3 and M4 are turned on according to the gate-on voltage VGL of the EM pulse EM(N). When the EM pulse EM(N) is the gate-on voltage VGL, the third and fourth switching elements M3 and M4 are turned on so that a current flows in the light-emitting element OLED. In this case, Vgs of the driving element DT becomes |Vgs|=VDD−(Vdata−|Vth|), and the current flowing in the light-emitting element OLED is K(VDD−Vdata)². K is a constant value determined by charge mobility, parasitic capacitance, and a channel capacity of the driving element DT.

FIG. 9 is a detailed cross-sectional view illustrating a cross-sectional structure of the display panel according to one embodiment of the present disclosure. It should be noted that the cross-sectional structure of the display panel 100 is not limited to FIG. 9.

Referring to FIG. 9, in the pixel circuit, the circuit layer 12, the light-emitting element and sensor layer 14, and the encapsulation layer may be stacked on a substrate GLS. The substrate GLS may be a glass substrate or an organic thin film substrate.

A first buffer layer BUF1 may be formed on the substrate GLS. A first metal layer may be formed on the first buffer layer BUF1, and a second buffer layer BUF2 may be formed on the first metal layer. The first metal layer is patterned in a photolithography process. The first metal layer may include a light shield pattern BSM. The light shield pattern BSM blocks external light so as to prevent or at least reduce an active layer of a TFT from being irradiated with light. Each of the first and second buffer layers BUF1 and BUF2 may be made of an inorganic insulating material and may be formed of one or more insulating layers. The first buffer layer BUF1 may be implemented as a multilayer buffer layer in which oxide layers and nitride layers are multiply stacked.

An active layer ACT may be formed of a semiconductor material, for example, amorphous silicon a-Si, deposited on the second buffer layer BUF2. In order to increase electron mobility, amorphous silicon a-Si may be crystallized by an excimer laser anneal (ELA) process to be converted into polycrystalline silicon. The active layer ACT may be patterned by a photolithography process. The active layer ACT includes an active pattern of each of a transistor in the pixel circuit, a transistor in the gate driver, and a transistor in the photosensor drive circuit. A partial portion of the active layer ACT may be metallized by ion doping. The metallized portion may be used as a jumper pattern connecting metal layers at some nodes of the pixel circuit to connect components of the pixel circuit.

A gate insulating layer GI may be formed on the active layer ACT. The gate insulating layer GI may be made of an inorganic insulating material. A second metal layer may be formed on the gate insulating layer GI. The second metal layer may be patterned by a photolithography process. The second metal layer may include a gate line, a gate electrode pattern GATE of the transistor, a lower electrode of the capacitor Cst1, and a jumper pattern connecting patterns of the first metal layer and a third metal layer.

A first interlayer insulating layer ILD1 may cover the second metal layer. The third metal layer may be formed on the first interlayer insulating layer ILD1, and a second interlayer insulating layer ILD2 may cover the third metal layer. The third metal layer may be patterned by a photolithography process. The third metal layer may include metal patterns TM such as an upper electrode of the capacitor Cst1 and the power lines. The first and second interlayer insulating layers ILD1 and ILD2 may include an inorganic insulating material.

A fourth metal layer may be formed on the second interlayer insulating layer ILD2, and an inorganic insulating layer PAS1 and a first planarization layer PLN1 may be stacked on the fourth metal layer. A fifth metal layer may be formed on the first planarization layer PLN1.

Some metal patterns of the fourth metal layer may be connected to the third metal layer through a contact hole passing through the first planarization layer PLN1 and the inorganic insulating layer PAS1. The first and second planarization layers PLN1 and PLN2 may be made of an organic insulating material which planarizes a surface.

The fourth metal layer may include first and second electrodes of the transistor connected to the active pattern of the transistor through a contact hole passing through the second interlayer insulating layer ILD2. One or more among the data line DL and the power lines PL1, PL2, and PL3 may be implemented as a pattern SD1 of the fourth metal layer or a pattern SD2 of the fifth metal layer.

An anode electrode AND of a light-emitting element OLED may be formed on the second planarization layer PLN2. The anode electrode AND may be connected to the electrode of the transistor used as a switching element or a driving element through a contact hole passing through the second planarization layer PLN2. The anode electrode AND may be made of a transparent or translucent electrode material.

Figure 20:
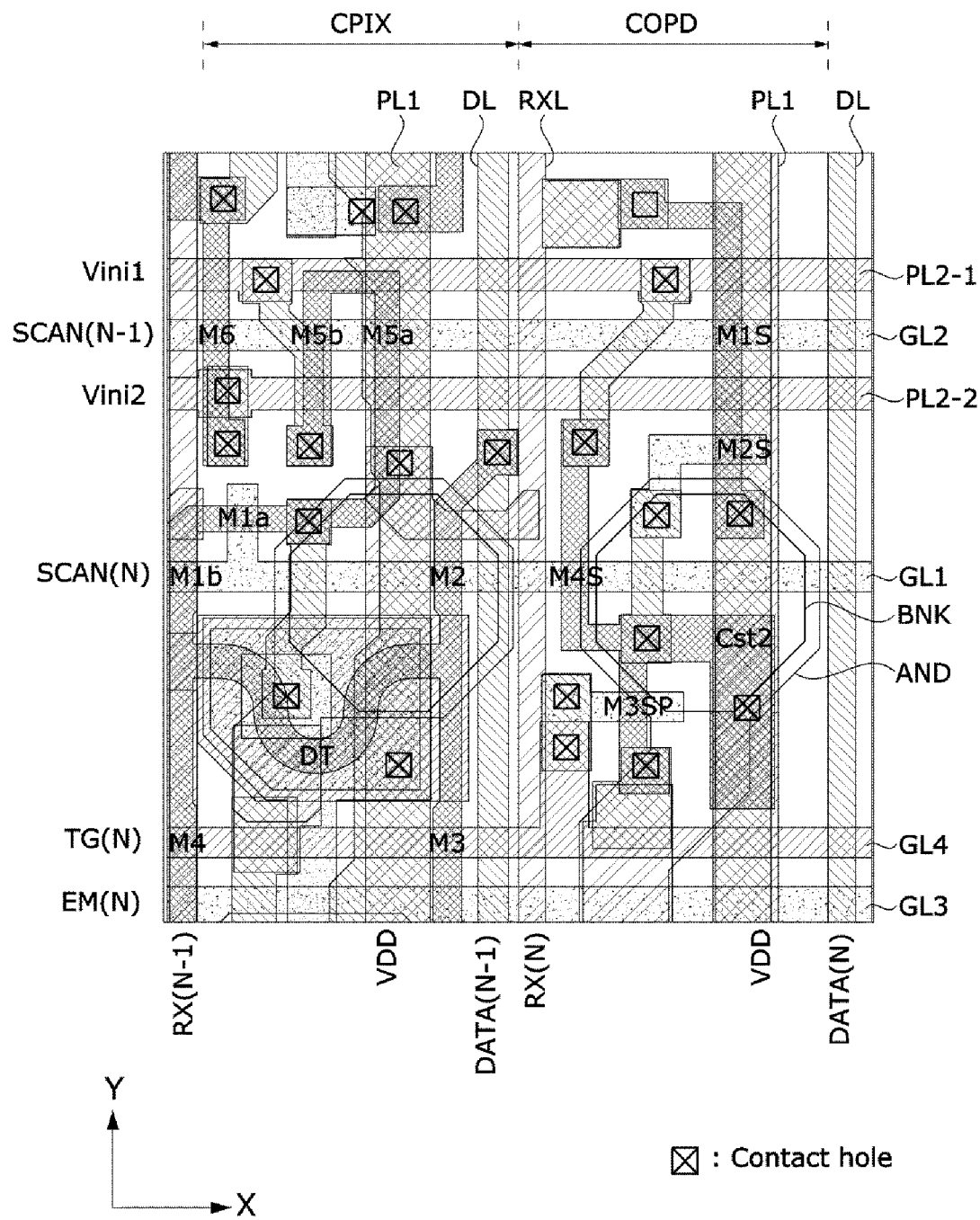
FIG. 20 is a detailed plan view illustrating layouts of the pixel circuit and the photosensor drive circuit according to an embodiment of the present disclosure.
Figure 21A:
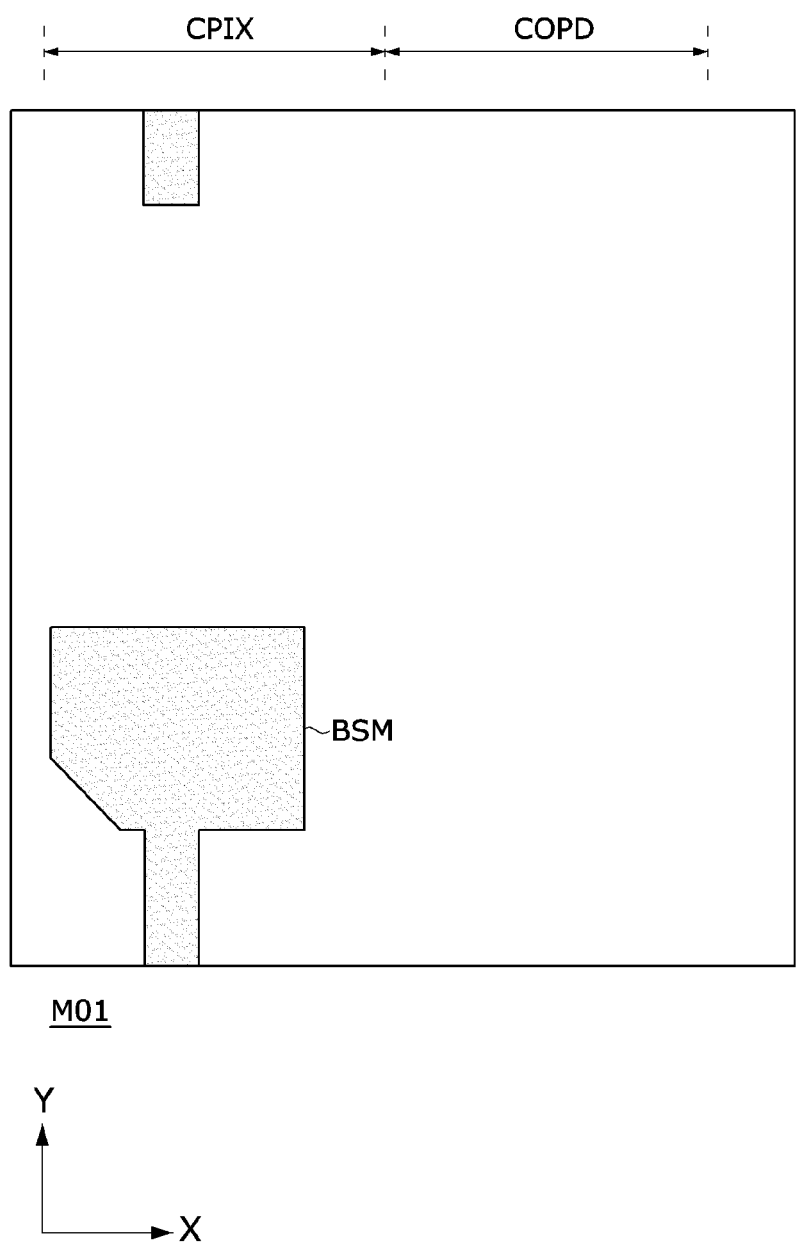
FIGS. 21A to 21G are plan views illustrating a pattern shape of each layer by separating main layers from the layouts of the pixel circuit and the photosensor drive circuit which are shown in FIG. 20 according to an embodiment of the present disclosure.
Figure 21B:
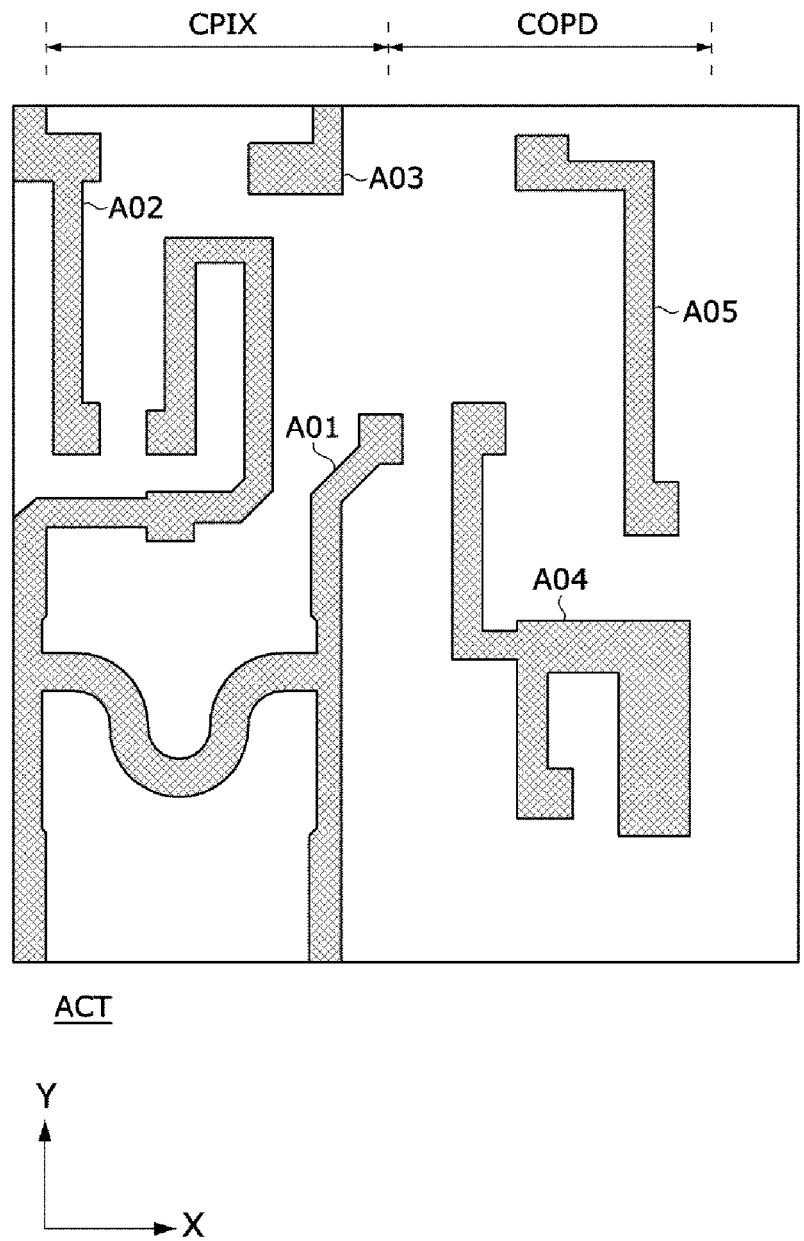
Figure 21C:
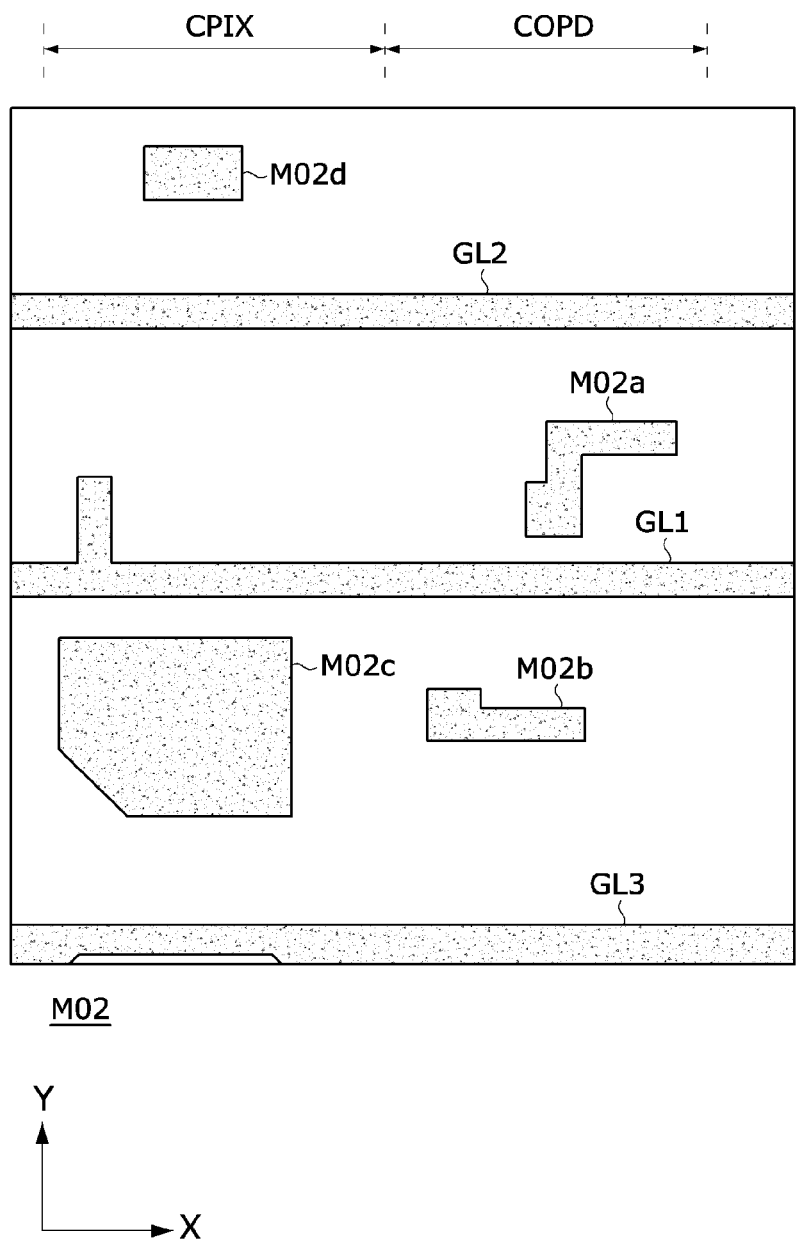
Figure 21D:
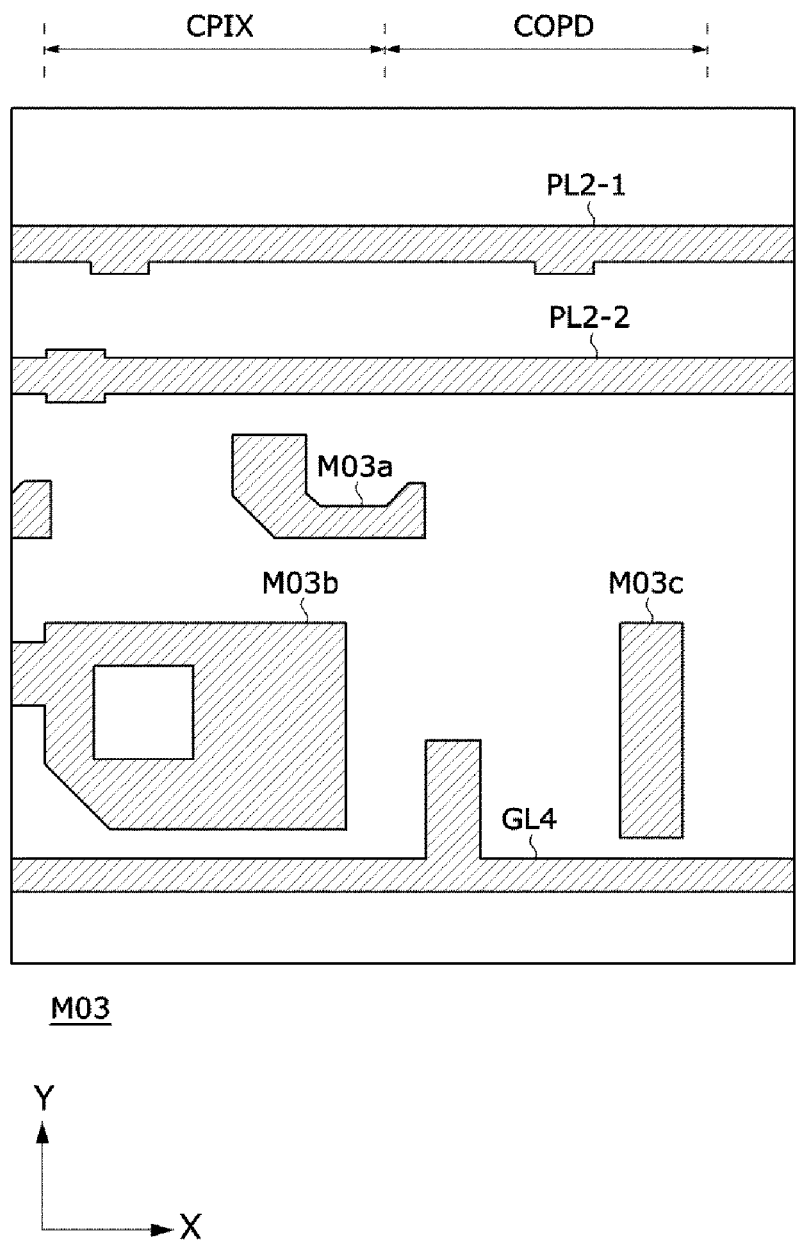
Figure 21E:
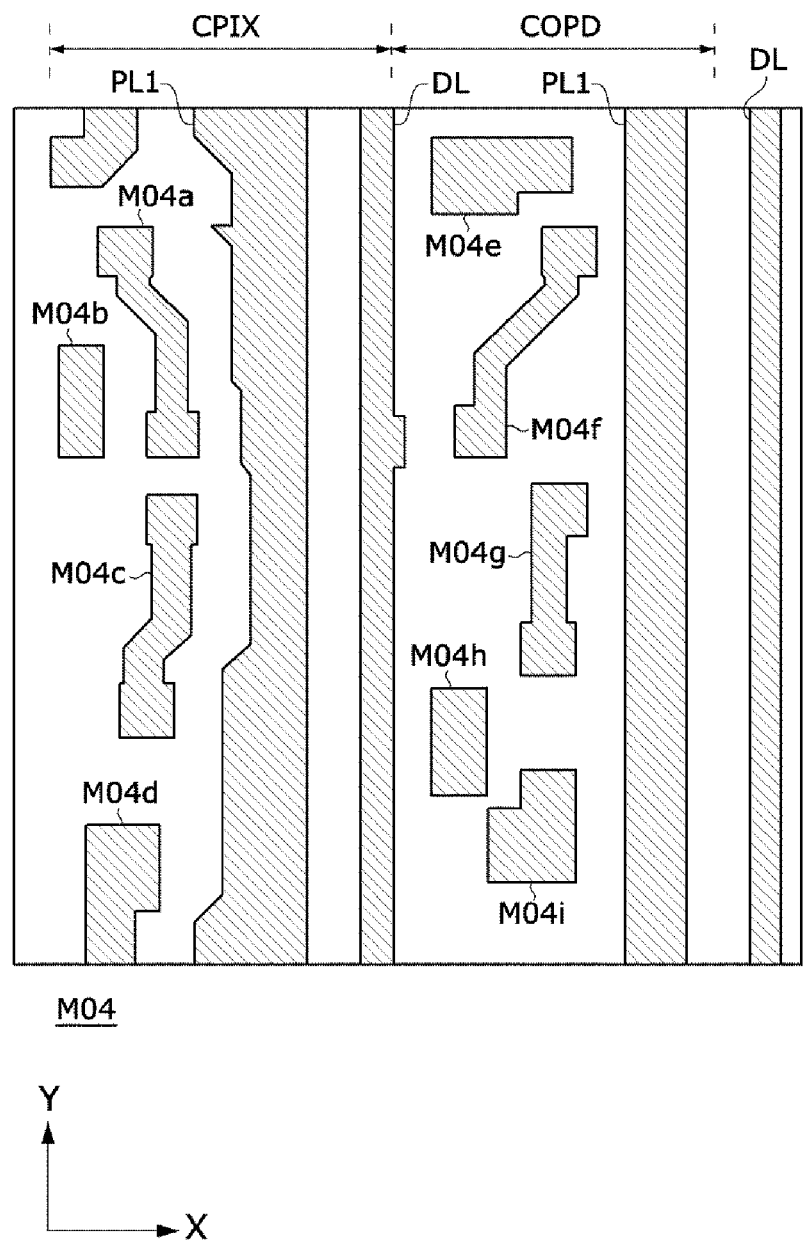
Figure 21F:
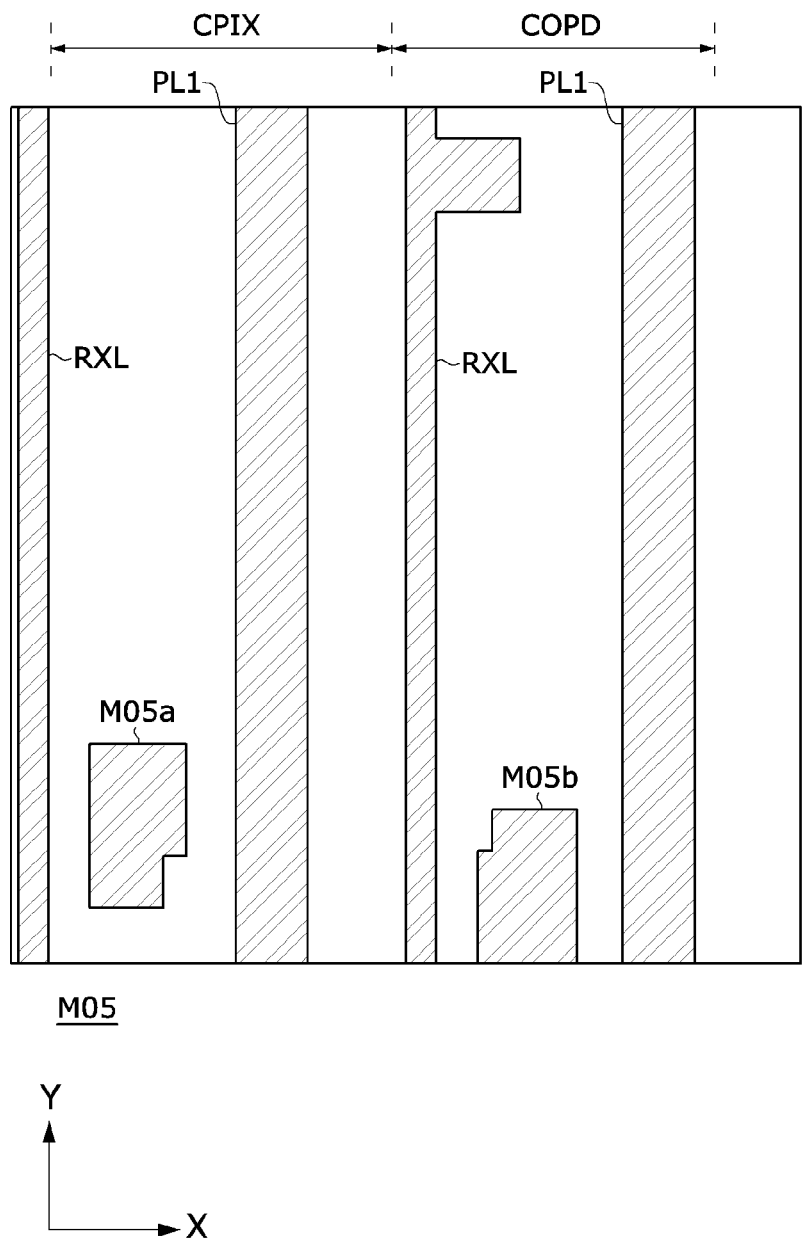
Figure 21G:
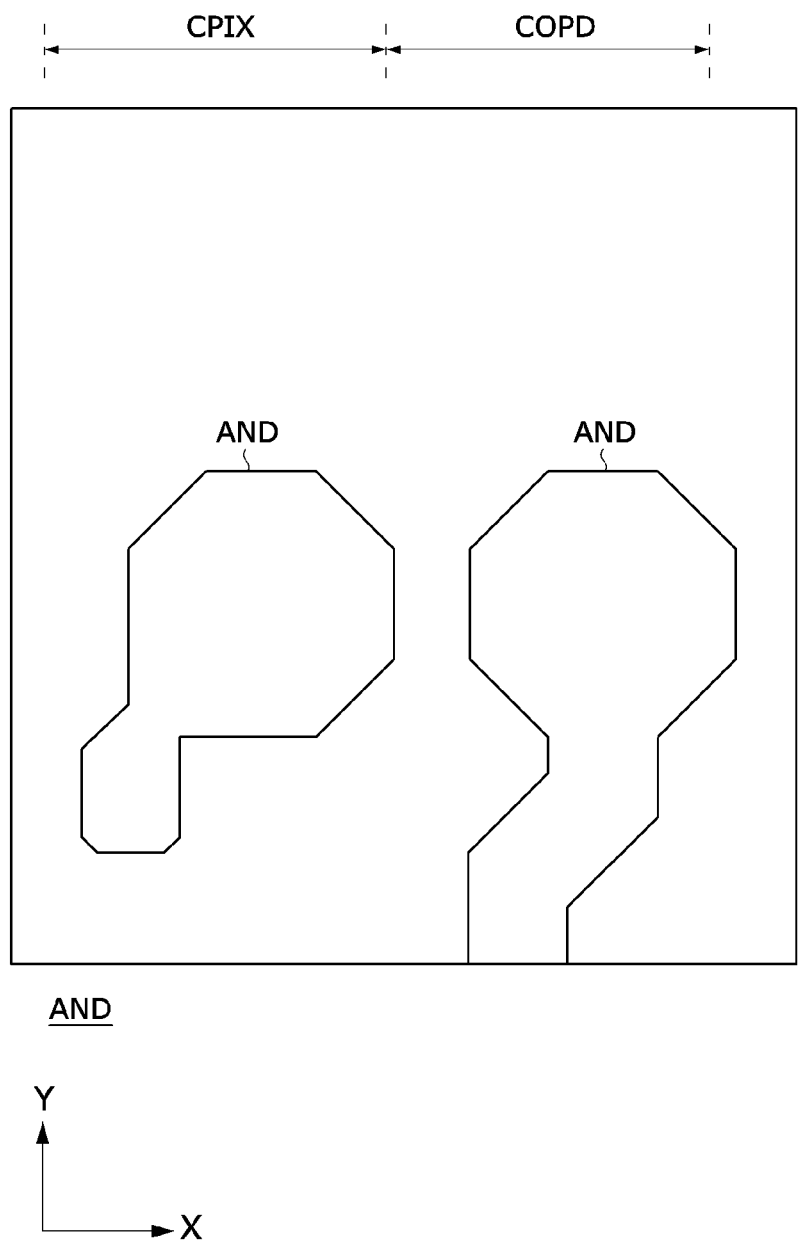

In the circuit layer 12 of the pixel circuit and the photo sensor drive circuit, the active layer and the metal layers may be patterned in the structure shown in FIGS. 20 to 21G.

A pixel defining layer BNK may cover the anode electrode AND of the light-emitting element OLED. The pixel defining layer BNK is formed as a pattern defining a light-emitting area (or an opening area) through which light passes from each of the pixels to the outside. A spacer SPC may be formed on the pixel defining layer BNK. The pixel defining layer BNK and spacer SPC may be integrated using the same organic insulating material. The spacer SPC secures a gap between a fine metal mask (FMM) and the anode electrode AND so as to prevent or at least reduce the FMM from being in contact with the anode electrode AND in a deposition process of an organic compound EL.

The organic compound EL is formed in the light-emitting area of each of the pixels defined by the pixel defining layer BNK. A cathode electrode CAT of the light-emitting element OLED is formed on an entire surface of the display panel 100 to cover the pixel defining layer BNK, the spacer SPC, and the organic compound EL. The cathode electrode CAT may be connected to a VSS line PL3 which is formed of any one among the metal layers below the cathode electrode CAT. A capping layer CPL may cover the cathode electrode CAT. The capping layer CPL is formed of an inorganic insulating material, and the capping layer CPL blocks infiltration of air and out gassing of an organic insulating material applied on the capping layer CPL, thereby protecting the cathode electrode CAT. An inorganic insulating layer PAS2 may cover the capping layer CPL, and a planarization layer PCL may be formed on the inorganic insulating layer PAS2. The planarization layer PCL may include an organic insulating material. An inorganic insulating layer PASS of the encapsulation layer may be formed on the planarization layer PCL.

The photodiode of the sensor pixel S may be implemented as an organic photodiode OPD. As shown in FIG. 10, an anode electrode AND of the organic photodiode OPD may be formed to be coplanar with the anode electrode AND of the light-emitting element OLED. The anode electrode AND of the organic photodiode OPD and the anode electrode AND of the light-emitting element OLED may be formed of separate patterns. The organic photodiode OPD and the light-emitting element OLED may be connected to a cathode electrode CAT, which is a common electrode. Thus, the cathode electrode may be shared in the organic photodiode OPD and the light-emitting element OLED.

A circuit layer of the first sensing area SA may be implemented in a structure similar to a structure of the pixel circuit and may share lines connected to the pixel circuit. Thus, at least a part of the photosensor drive circuit may be implemented in a structure which shares the pixel circuit.

FIG. 10 is a diagram illustrating cross-sectional structures of the organic photodiode OPD of the sensor pixel S and the light-emitting element OLED of the display pixel according to one embodiment of the present disclosure.

Referring to FIG. 10, the organic photodiode OPD may be implemented in a structure which is substantially the same as a structure of the light-emitting element OLED.

The light-emitting element OLED includes the anode electrode AND, the hole injection layer HIL, the hole transport layer HTL, the light emission layer EML, the electron transport layer ETL, the electron injection layer EIL, and the cathode electrode CAT which are stacked on the pixel circuit CPIX. The hole injection layer HIL is in contact with the anode electrode AND of light-emitting element OLED, and the electron injection layer EIL is in contact with the cathode electrode CAT.

The organic photodiode OPD includes the anode electrode AND, the hole injection layer HIL, the hole transport layer HTL, an active layer ACT-OPD, the electron transport layer ETL, the electron injection layer EIL, and the cathode electrode CAT which are stacked on the photosensor drive circuit COPD. The active layer ACT-OPD of the organic photodiode OPD includes an organic semiconductor material.

A low potential power voltage VSS and the pixel driving voltage VDD are commonly applied to the pixel circuit CPIX and the photosensor drive circuit COPD. The cathode electrode CAT of the light-emitting element OLED and the cathode electrode CAT of the organic photodiode OPD share the same metal electrode and are commonly connected to the VSS line PL3. The anode electrode AND of the light-emitting element OLED and the anode electrode AND of the organic photodiode OPD may be divided into metal patterns formed on the same layer. The anode electrode AND of the light-emitting element OLED is electrically separated from the anode electrode AND of the organic photodiode OPD.

Organic semiconductor materials which may be coated by a solution process, for example, one or two or more organic semiconductor materials among P3HT:PC61BM, squaraine: PC61BM, C60, PBDTTT-C:PC71BM, PDPP3T:PC71BM, PCDTBT:PC61BM, PVK:PC71BM, PCDTBT:PC71BM, ZnO:F8T2, PBDT-TFTTE:PC71BM, P3HT:PC61BM, TAPC:C60, P3HT:PC60BM, PFBT2OBT:PC71BM, PIDT-TPD:PC61BM, P3HT:PC71BM, PV-D4650:PC61BM, P3HT:O-IDTBR, and 2,9-dimethylquinacridone (2,9-DMQA), may be used as the active layer ACT-OPD of the organic photodiode OPD, but the present disclosure is not limited thereto. Since the organic semiconductor material may be processed in a solution process at a relatively low temperature when compared with an inorganic semiconductor material formed in a high-temperature deposition process, a manufacturing cost may be reduced and the organic semiconductor material may be applied to a flexible display.

As can be seen from FIG. 10, the organic photodiode OPD has a cross-sectional structure that is substantially the same as the cross-sectional structure of the light-emitting element OLED, and most of the layers may be formed of the same material as the light-emitting element OLED. The organic photodiode OPD and the light-emitting element OLED may be shared and may share the power lines and the gate lines. Thus, since the light-emitting element OLED and the organic photodiode OPD may be formed in the same manufacturing process and have the same cross-sectional structure, most circuit components are shared so that a structure of the display panel 100 may be simplified.

FIG. 11 is a detailed diagram illustrating an active interval and a vertical blank period of one frame period. In FIG. 11, a vertical synchronization signal Vsync, a horizontal synchronization signal Hsync, and a data enable signal DE are timing signals synchronized with an input image signal. The timing signals may be generated from the host system, synchronized with the input image signal, and input to the timing controller of the display device. In a mobile device, the above timing signals may be generated in a further simplified format.

Referring to FIG. 11, one frame is divided into an active interval AT in which pixel data of an input image is input from the host system 200, and a vertical blank period VB in which the pixel data is not present. During the active interval AT, pixel data of one frame, which will be written in all pixels P on a screen AA of the display panel 100, is received by the drive IC 300 and written in the pixels P.

The vertical blank period VB is a blank period in which the pixel data is not received by the drive IC 300 between an active interval AT of a $(N-1)^{th}$ frame (N is a natural number) and an active interval AT of an $N^{th}$ frame. The vertical blank period VB includes a vertical sync time VS, a vertical front porch FP, and a vertical back porch BP.

The vertical synchronization signal Vsync defines one frame period. The horizontal synchronization signal Hsync defines one horizontal period 1H. The data enable signal DE defines a valid data interval including pixel data which will be displayed on the screen AA. A pulse of the data enable signal DE is synchronized with the pixel data which will be written in the pixels P of the display panel 100. One pulse cycle of the data enable signal DE is one horizontal period 1H.

Figure 12:
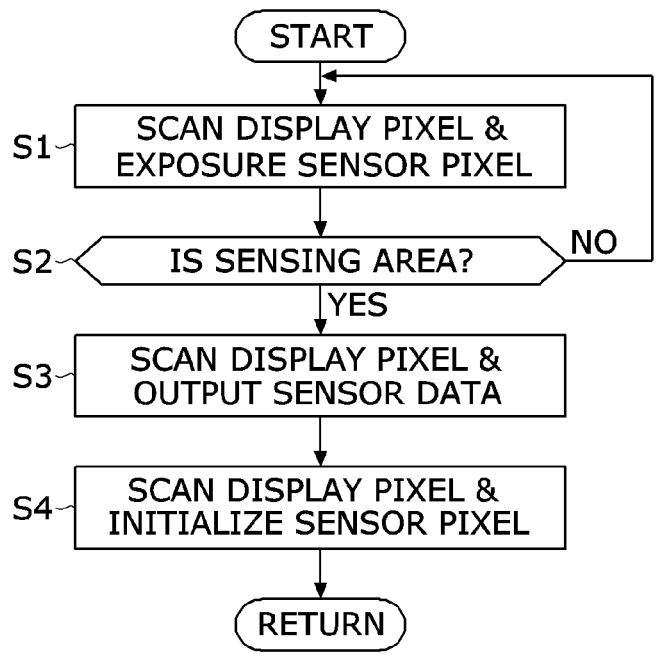
FIGS. 12 and 13 are diagrams illustrating a method of driving a display device according to an embodiment of the present disclosure.
Figure 13:
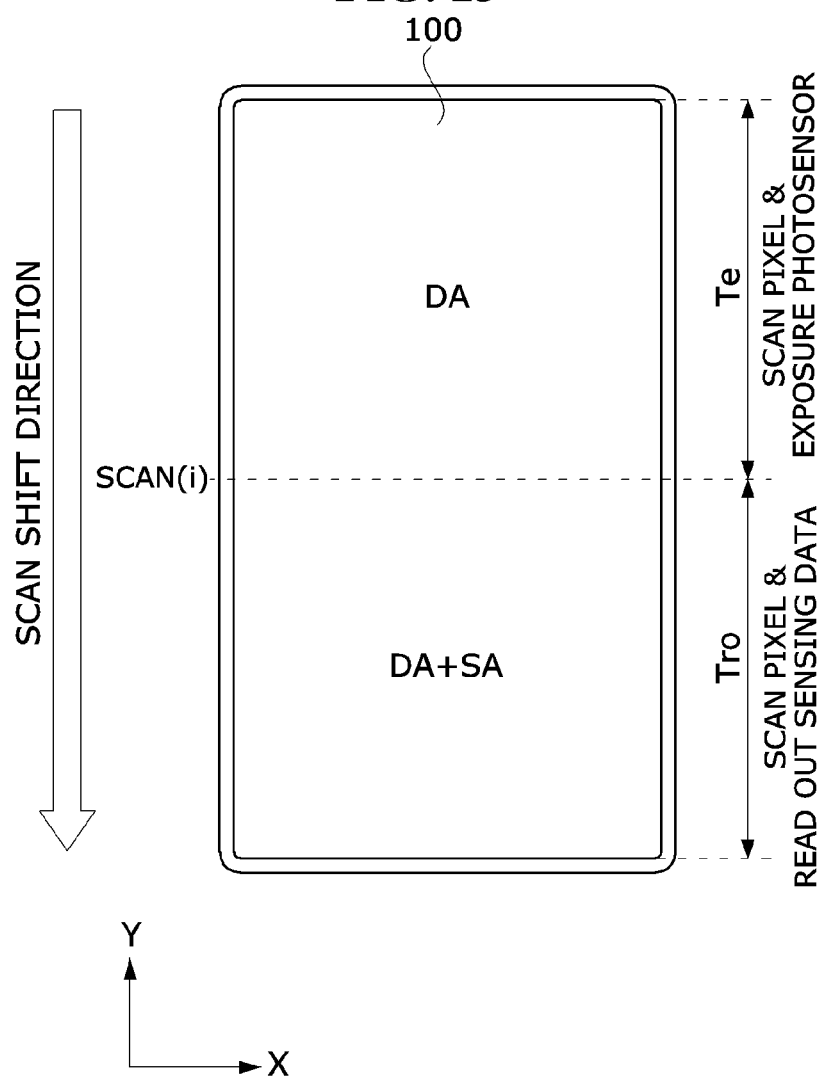

FIGS. 12 and 13 are diagrams illustrating a method of driving the display device according to the embodiment of the present disclosure.

Referring to FIGS. 12 and 13, the display device of the present disclosure may count a timing signal synchronized with an input image to determine a pixel position in which currently input pixel data is to be written.

The display device sequentially scans the display pixels R, G, and B in a pixel line unit of the display panel 100 and writes the pixel data in the display pixels R, G, and B.

The sensing area SA may be disposed in a portion of the display area DA. When viewed from a scan shift direction of the display pixels, the display pixels R, G, and B and the sensor pixels S may be simultaneously driven in the display area DA overlapping the sensing area SA.

The display pixels are scanned before reaching the sensing area SA. After the sensor pixels are exposed for a predetermined time, the sensor pixels may output a photoelectrically converted signal (sensor data) and then may be initialized.

Only display pixels R, G, and B are scanned before reaching the sensing area SA. This period includes an exposure time Te in which the sensor pixels are exposed. Thus, during the exposure time Te, the display pixels R, G, and B are scanned and, simultaneously, the sensor pixels S are exposed to light (51).

In a process of sequentially shifting a scan of the display pixels by one line, when a pixel line including the sensor pixels S of the sensing area SA, for example, a pixel line connected to an $i^{th}$ scan line (i is a positive integer greater than two) is scanned, the display pixels R, G, and B are scanned and, simultaneously, output signals of the sensor pixels S, that is, photoelectrically converted signals, are read out through an RX line RXL. A photosensor drive circuit COPD of the sensor pixels S is driven in a source follower manner and outputs the photoelectrically converted signals to the RX line RXL. Thus, after the exposure time Te, during the output of the sensor pixel and an initialization time Tro, the display pixels R, G, and B are scanned in the pixel lines included in the sensing area SA and, simultaneously, the photoelectrically converted signals are output from the sensor pixels S (S2 and S3).

The sensor pixel S, which outputs the photoelectrically converted signal in the pixel lines included in the sensing area SA, is initialized at an initialization voltage Vini. When the sensor pixel S is initialized, pixels disposed in the same pixel line are scanned and pixel data is written in the pixels. The sensor pixel S of the pixel lines included in the sensor pixels S in the sensing area SA is initialized after sequentially outputting sensor data according to a sequentially shifted scan pulse, and the display pixels are sequentially scanned by one pixel line (S4).

Figure 14:
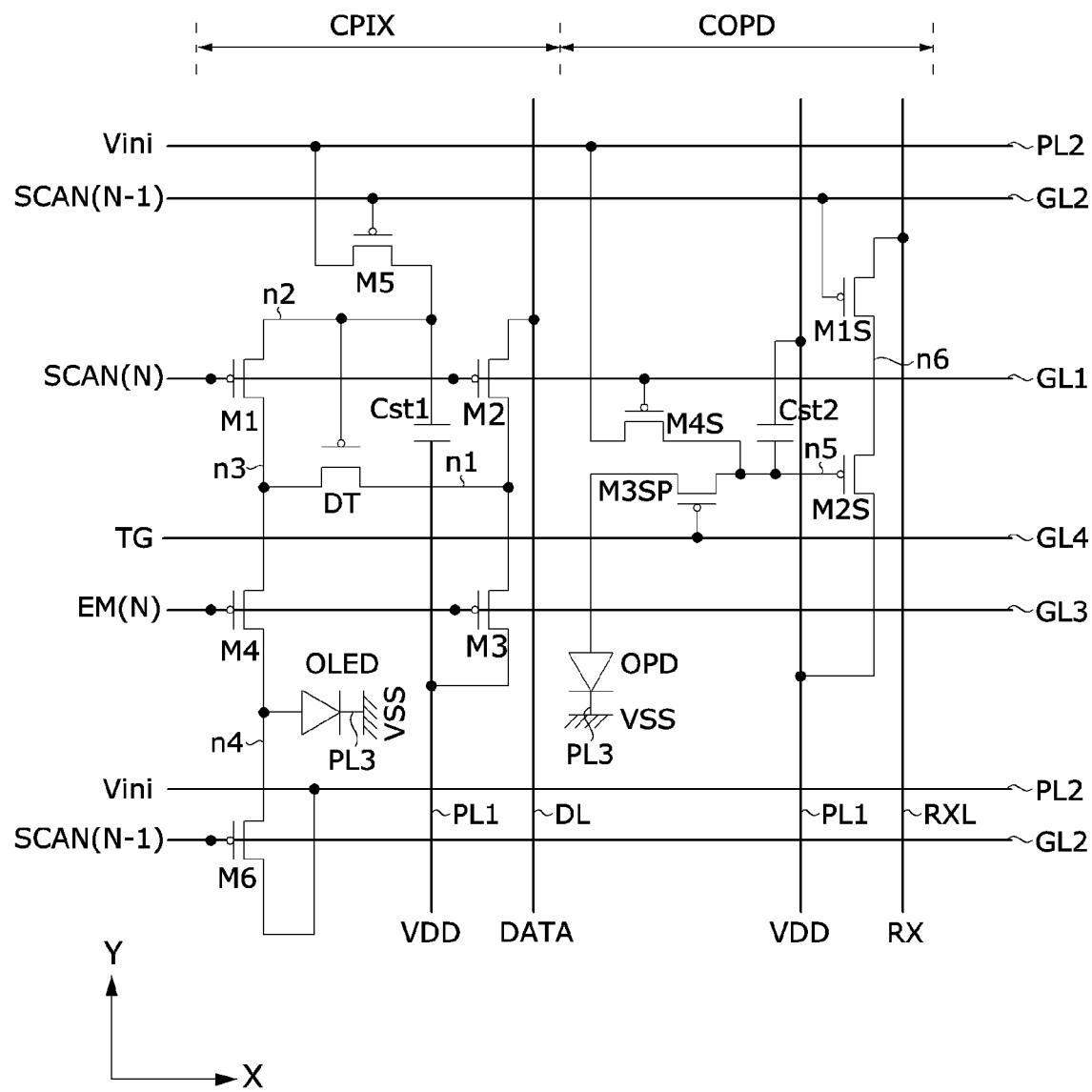
FIG. 14 is a circuit diagram illustrating a pixel circuit and a photosensor drive circuit according to a first embodiment of the present disclosure.
Figure 15:
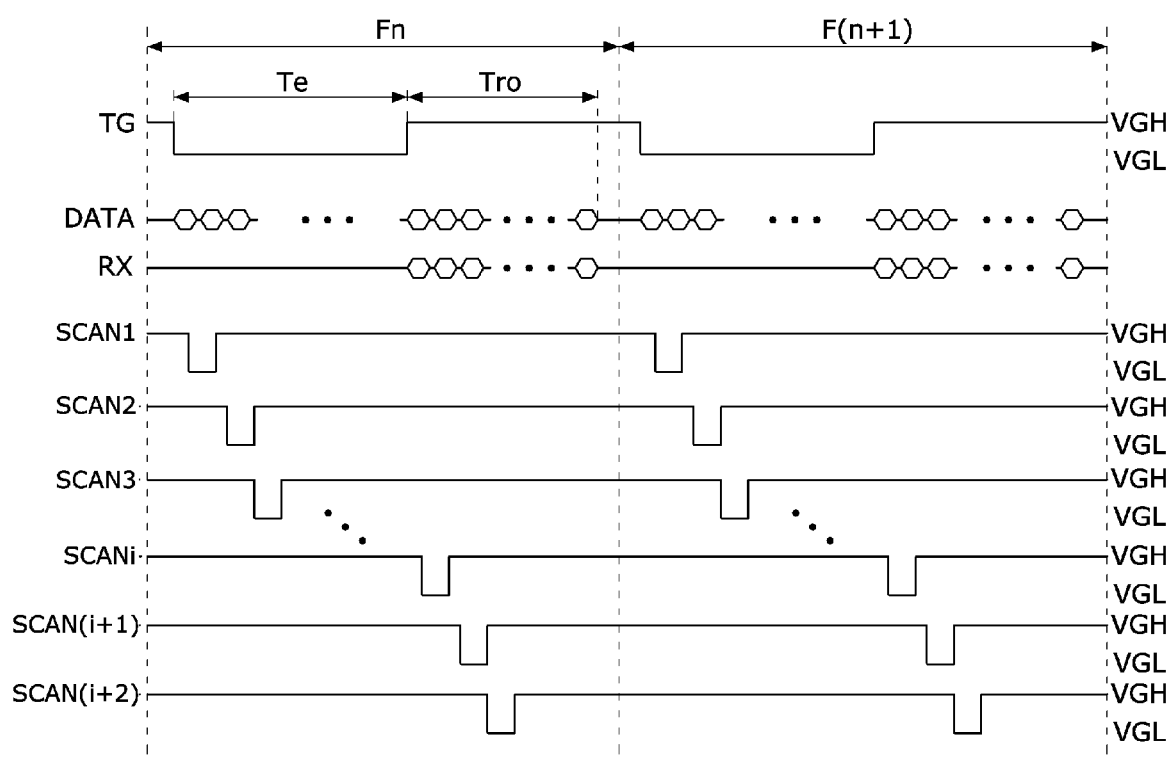
FIG. 15 is a waveform diagram illustrating a driving method of the pixel circuit and the photosensor drive circuit shown in FIG. 14 according to an embodiment of the present disclosure.

FIG. 14 is a circuit diagram illustrating a pixel circuit and a photosensor drive circuit according to a first embodiment of the present disclosure. FIG. 15 is a waveform diagram illustrating a driving method of the pixel circuit CPIX and the photosensor drive circuit COPD shown in FIG. 14 according to one embodiment. The pixel circuit CPIX is described above with reference to FIGS. 6 to 8, and thus a detailed description thereof will be omitted herein. In FIG. 15, "DATA" is pixel data which is synchronized with scan pulses SCAN1 to SCAN(i+2) to be written in the display pixels R, G, and B, and "RX" is sensor date which is synchronized with scan pulses SCANi to SCAN(i+2) to be output from the sensor pixels S. "Fn" is an $n^{th}$ frame period (n is a positive integer), and "F(n+1)" is a $(n+1)^{th}$ frame period.

Among the pixel lines including the sensor pixels S, sensor data RX starts to be output from a pixel line into which pixel data is written in response to the $i^{th}$ scan pulse SCANi. Thus, the output of the sensor pixel S and the initialization time Tro may be set as a time from the $i^{th}$ scan pulse SCANi to a scan pulse applied to a last pixel line of the first sensor area SA. In FIG. 14, the $(N-1)^{th}$ scan pulse SCAN(N-1) may be any one among the $i^{th}$ scan pulse SCANi to the $(i+2)^{th}$ SCAN(i+2) which are shown in FIG. 15.

Referring to FIG. 14, the pixel circuit CPIX and the photosensor drive circuit COPD share the power lines PL1, PL2, and PL3. Thus, power such as VDD, Vini, and VSS is commonly applied to the pixel circuit CPIX and the photosensor drive circuit COPD.

The photosensor drive circuit COPD drives the organic photodiode OPD and outputs sensor data RX which is generated as a photoelectrically converted signal by the organic photodiode OPD. The sensor data RX may be transmitted by the organic photodiode OPD to the fingerprint recognition processor 500 through the RX line RXL.

The photosensor drive circuit COPD is connected to the VDD line PL1, the Vini line PL2, the VSS line PL3, the gate lines GL1, GL2, GL3, and GL4, and the RX line RXL. The gate lines GL1 to GL4 may be formed as parallel lines intersecting the RX line RXL and the data line DL. The RX line RXL may be formed as parallel lines to the data line DL and the VDD line PL1.

In response to the $(N-1)^{th}$ scan pulse SCAN(N-1), the photosensor drive circuit COPD outputs the sensor data RX and then is initialized according to the $N^{th}$ scan pulse SCAN(N). The $(N-1)^{th}$ scan pulse SCAN(N-1) is an example of a scan pulse which is generated prior to the $N^{th}$ scan pulse SCAN(N). Since the $(N-1)^{th}$ scan pulse SCAN(N-1) may be replaced with another scan pulse, for example, a (N-2) scan pulse SCAN(N-2), it should be noted that the scan pulse is not limited to the $(N-1)^{th}$ scan pulse SCAN(N-1).

The photosensor drive circuit COPD includes the organic photodiode OPD, a capacitor Cst2, and the switching circuit. In response to the scan pulses SCAN(N-1) and SCAN(N) and the exposure signal TG, the switching circuit switches a current path between the organic photodiode OPD and the RX line RXL.

The switching circuit is connected to the organic photodiode OPD, the capacitor Cst2, the first power line PL1, the second power line PL2, the third power line PL3, the RX line RXL, and the gate lines GL1, GL2, GL3, and GL4. The switching circuit includes first-S to fourth-S switching elements M1S to M4S. Each of the first-S to fourth-S switching elements M1S to M4S may be implemented as a p-channel TFT.

The organic photodiode OPD includes an anode electrode connected to a third-S switching element M3SP, a cathode electrode to which a low potential power voltage VSS is applied, and an active layer formed between the anode electrode and the cathode electrode. The cathode electrode is connected to the third power line PL3. The active layer ACT-OPD of the organic photodiode OPD includes an organic semiconductor material. When a reverse bias voltage is applied, the organic photodiode OPD generates an electric current according to received light. Due to charges generated by the electric current, a voltage of the fifth node n5, to which the gate electrode of the second-S switching element M2S is connected, is varied. The capacitor Cst2 is charged with a voltage difference between the voltage of the fifth node n5 and the pixel driving voltage VDD.

It should be noted that the anode electrode of the organic photodiode OPD and the anode electrode of the light-emitting element OLED are disposed on the same layer in the cross-sectional structure of the display panel 100 and share the cathode electrode. Due to the above structure, the anode electrode of the photodiode OPD is connected to a first electrode of the third-S switching element M3SP.

The capacitor Cst2 is connected between the fifth node n5 and the VDD line PL1. When the third-S switching element M3SP is turned on, the capacitor Cst2 maintains the voltage of the fifth node n5 which is charged with charges from the organic photodiode OPD. The exposure time Te of the sensor pixel S is determined according to a pulse width of the exposure signal TG which is applied to a gate electrode of the third-S switching element M3SP. As the pulse width of the exposure signal TG generated as the gate-on voltage VGL is increased, the exposure time Te becomes longer so that an amount of charges flowing to the fifth node n5 is increased.

The first-S switching element M1S is turned on in response to the gate-on voltage VGL of the $(N-1)^{th}$ scan pulse SCAN(N-1) to connect a sixth node n6 to the RX line RXL. The sixth node n6 is connected to a second electrode of the first-S switching element M1S and a first electrode of the second-S switching element M2S. A gate electrode of the first-S switching element M1S is connected to the second gate line GL2 to which the (N−1)$^{th}$ scan pulse SCAN(N−1) is applied. A first electrode of the first-S switching element M1S is connected to the second node n2, and the second electrode thereof is connected to the RX line RXL. When the first-S switching element M1S is turned on, the sensor data RX is output through the RX line RXL.

The second-S switching element M2S adjusts an amount of a current flowing between the VDD line PL1, and the sixth node n6 through the RX line RXL according to a gate voltage, that is, the voltage of the fifth node n5. The second-S switching element M2S includes a gate electrode connected to the fifth node n5, the first electrode connected to the sixth node n6, and the second electrode connected to the VDD line PL1. The fifth node n5 is connected to the second electrode of the third-S switching element M3SP, the capacitor Cst2, and the gate electrode of the second-S switching element M2S.

The third-S switching element M3SP is turned on in response to the gate-on voltage VGL of the exposure signal TG to connect the anode electrode of the organic photodiode OPD to the fifth node n5. When the third-S switching element M3SP is in an ON state, the charges flow from the organic photodiode OPD to the fifth node n5. The third-S switching element M3SP includes the gate electrode connected to the fourth gate line GL4 to which the exposure signal TG is applied, a first electrode connected to the anode electrode of the organic photodiode OPD, and a second electrode connected to the fifth node n5. During the exposure time Te, the exposure signal TG is generated as the gate-on voltage VGL, and during the output of the sensor pixel S and the initialization time Tro, the exposure signal TG is generated as the gate-off voltage VGH. Thus, during the exposure time Te, the third-S switching element M3SP is in the ON state and during the output of the sensor pixel S and the initialization time Tro, the third-S switching element M3SP is in an OFF state.

The fourth-S switching element M4S is turned on in response to the gate-on voltage VGL of the N$^{th}$ scan pulse SCAN(N) to initialize the fifth node n5 at the initialization voltage Vini. The fourth-S switching element M4S includes a gate electrode connected to the first gate line GL1 to which the N$^{th}$ scan pulse SCAN(N) is applied, a first electrode connected to the Vini line PL2 to which the initialization voltage Vini is applied, and a second electrode connected to the fifth node n5.

The initialization voltage Vini charges main nodes of the pixel circuit CPIX and also initializes main nodes of the photosensor drive circuit COPD. The initialization voltage Vini may be set to a voltage that is lower or equal to than the low potential power voltage VSS.

The anode electrodes of the photodiode OPD and the light-emitting element OLED may be formed on the same layer, and the cathode electrodes of the photodiode OPD and the light-emitting element OLED may be formed on the same layer to be shared. The pixel circuit CPIX and the photosensor drive circuit COPD share one or more gate line. Thus, according to the present disclosure, a structure of the display panel 100 may be implemented to be simplified to reduce an increase in the number of manufacturing processes, thereby reducing a manufacturing cost of the display panel 100.

Referring to FIG. 15, the display pixels R, G, and B are sequentially scanned line by line during the active interval AT. When viewed from a point of view of the driving of the sensor pixels, one frame of the display device may be divided into the exposure time Te, the output of the sensor pixel S, and the initialization time Tro. The exposure time Te may be set within the active interval AT or may further be set to a time including at least a part of the active interval AT and the vertical blank period VB. The sensor data output time Tro may be set as a time within the active interval AT in which a scan signal is applicable to sensor pixels S in the first sensing area SA.

During the active interval AT in which the pixel data is received by the timing controller 303, the scan pulses SCAN1 to SCAN(i+2) and the EM pulse omitted from the drawing are generated, and these pulses are sequentially shifted.

During the exposure time Te, the first to third scan pulses SCAN1 to SCAN5 may be applied to the display pixels R, G, and B of the pixel lines in which the sensor pixels S are not present. During the exposure time Te, in the pixel lines in which the sensor pixels S are not present, the pixel data may be written in the display pixels R, G, and B, and the organic photodiode OPD of the sensor pixel S may be exposed to light to generate an electric current.

During the output of the sensor pixels S and the initialization time Tro, the i$^{th}$ scan pulse SCANi to the (i+2)$^{th}$ scan pulse SCAN(i+2) may be applied to the display pixels R, G, and B and the sensor pixels S in the first sensing area SA. During the output of the sensor pixels S and the initialization time Tro, the pixel data is written in the display pixels R, G, and B, the sensor data RX is output from the sensor pixels S, and then the sensor pixels S are initialized.

Figure 16:
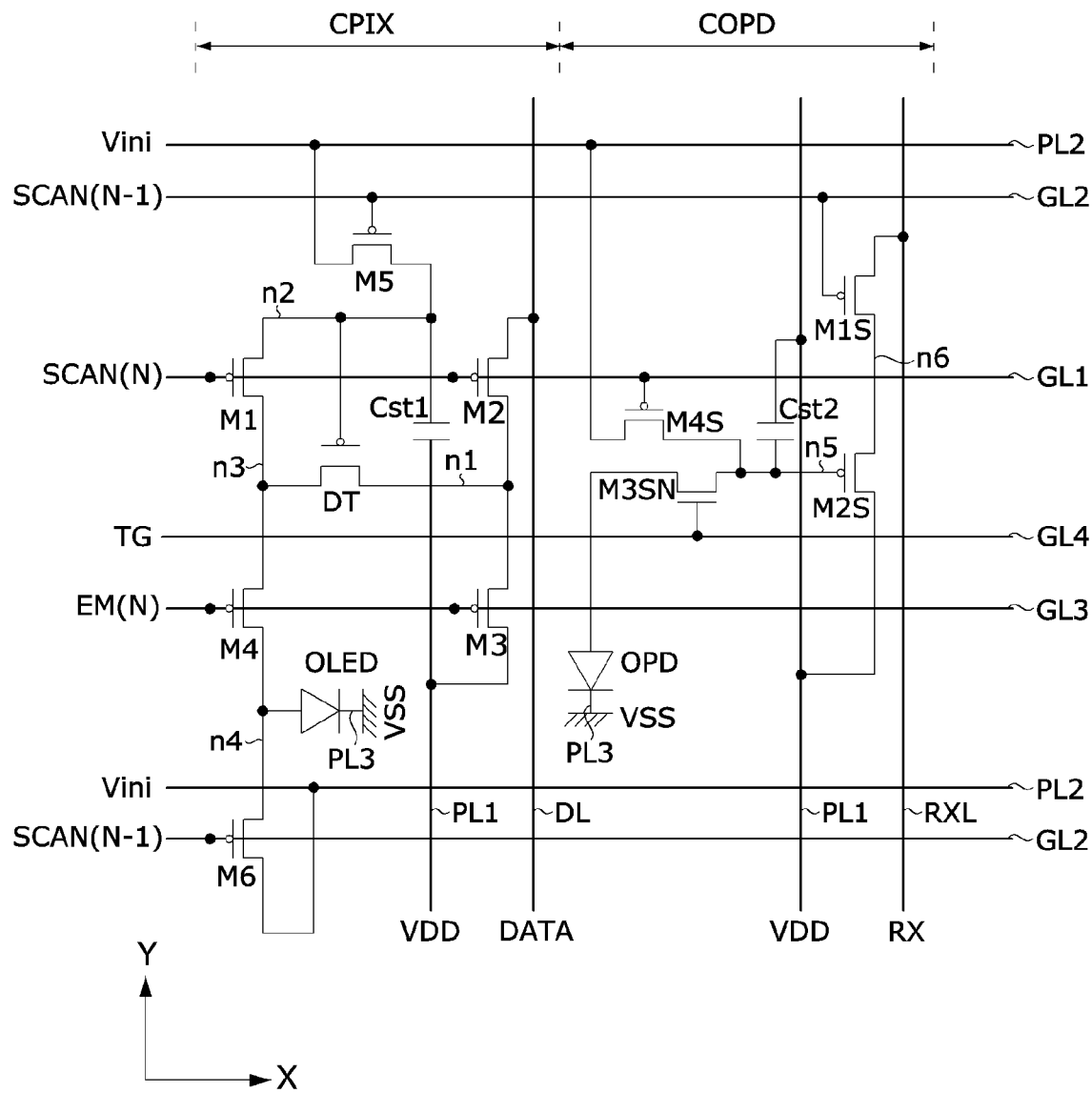
FIG. 16 is a circuit diagram illustrating a pixel circuit and a photosensor drive circuit according to a second embodiment of the present disclosure.
Figure 17:
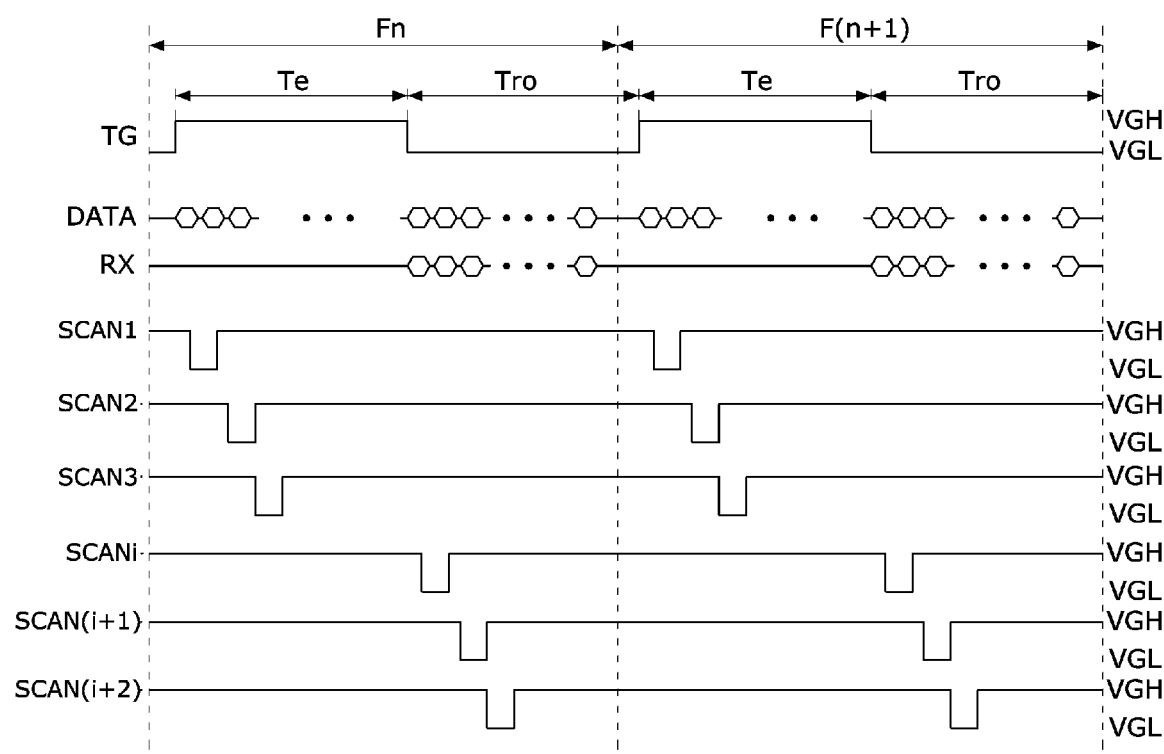
FIG. 17 is a waveform diagram illustrating a driving method of the pixel circuit and the photosensor drive circuit shown in FIG. 16 according to an embodiment of the present disclosure.

FIG. 16 is a circuit diagram illustrating a pixel circuit and a photosensor drive circuit according to a second embodiment of the present disclosure. FIG. 17 is a waveform diagram illustrating a driving method of the pixel circuit and the photosensor drive circuit shown in FIG. 16 according to one embodiment. In FIGS. 16 and 17, components which are substantially the same as those of the above-described embodiments are assigned to the same reference numerals, and detailed descriptions thereof will be omitted herein.

Referring to FIGS. 16 and 17, in order to reduce an OFF current in an OFF state, a third-S switching element M3SN of a photosensor drive circuit COPD may be implemented as an n-channel oxide TFT. In the n-channel oxide TFT, a gate-on voltage is VGH. During an exposure time Te, a pulse of an exposure signal TG is generated as a pulse of a gate-on voltage VGH, and during an output of sensor pixels S and an initialization time Tro, the exposure signal TG is generated as a gate-off voltage VGL. Thus, during the exposure time Te, the third-S switching element M3SN is in an ON state, and during the output of the sensor pixel S and the initialization time Tro, the third-S switching element M3SN is in an OFF state.

Figure 18:
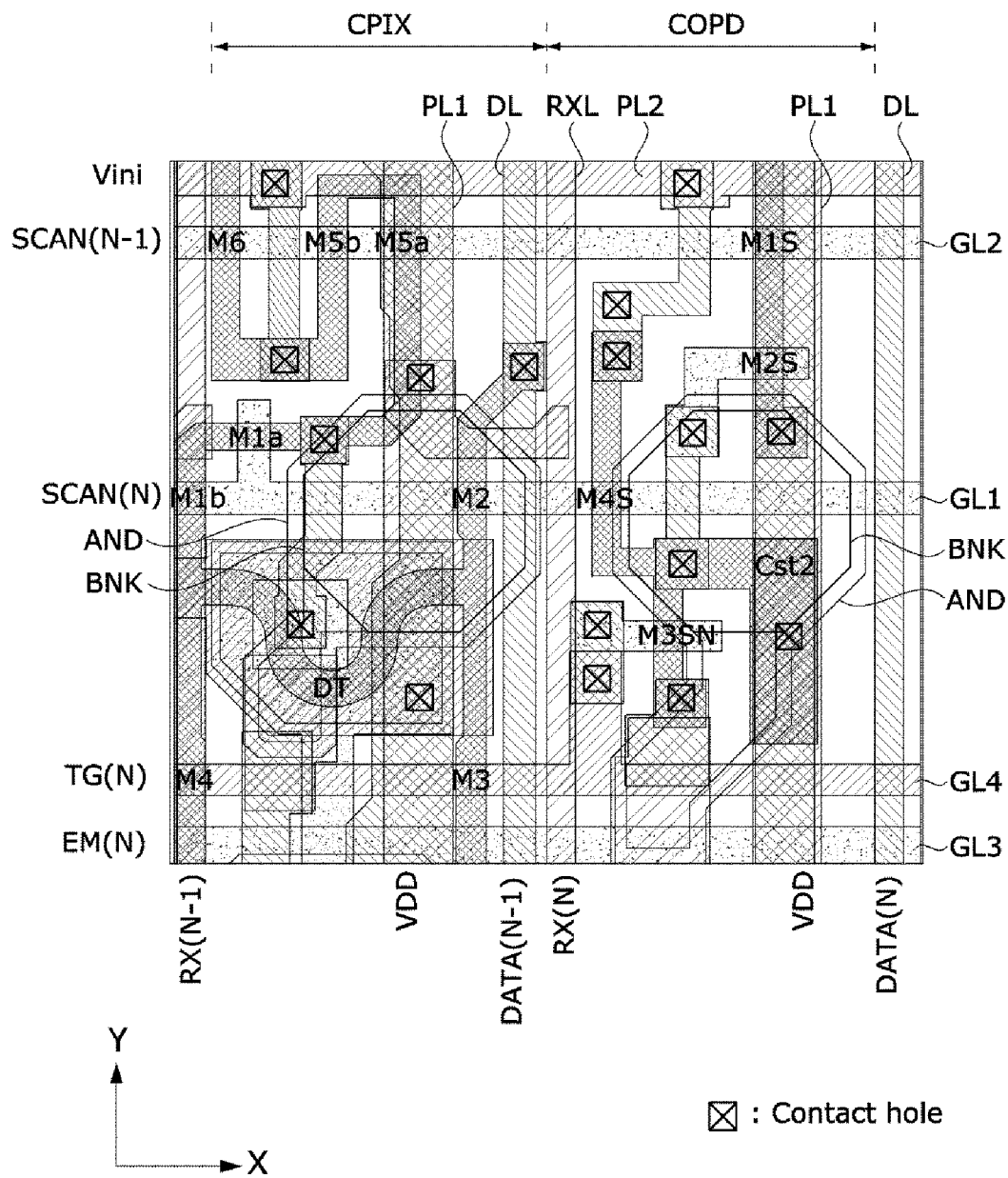
FIG. 18 is a detailed plan view illustrating layouts of the pixel circuit and the photosensor drive circuit shown in FIGS. 14 and 16 according to an embodiment of the present disclosure.

FIG. 18 illustrates layouts of the pixel circuit CPIX and the photosensor drive circuit COPD shown in FIGS. 14 and 16 according to one embodiment.

Figure 19:
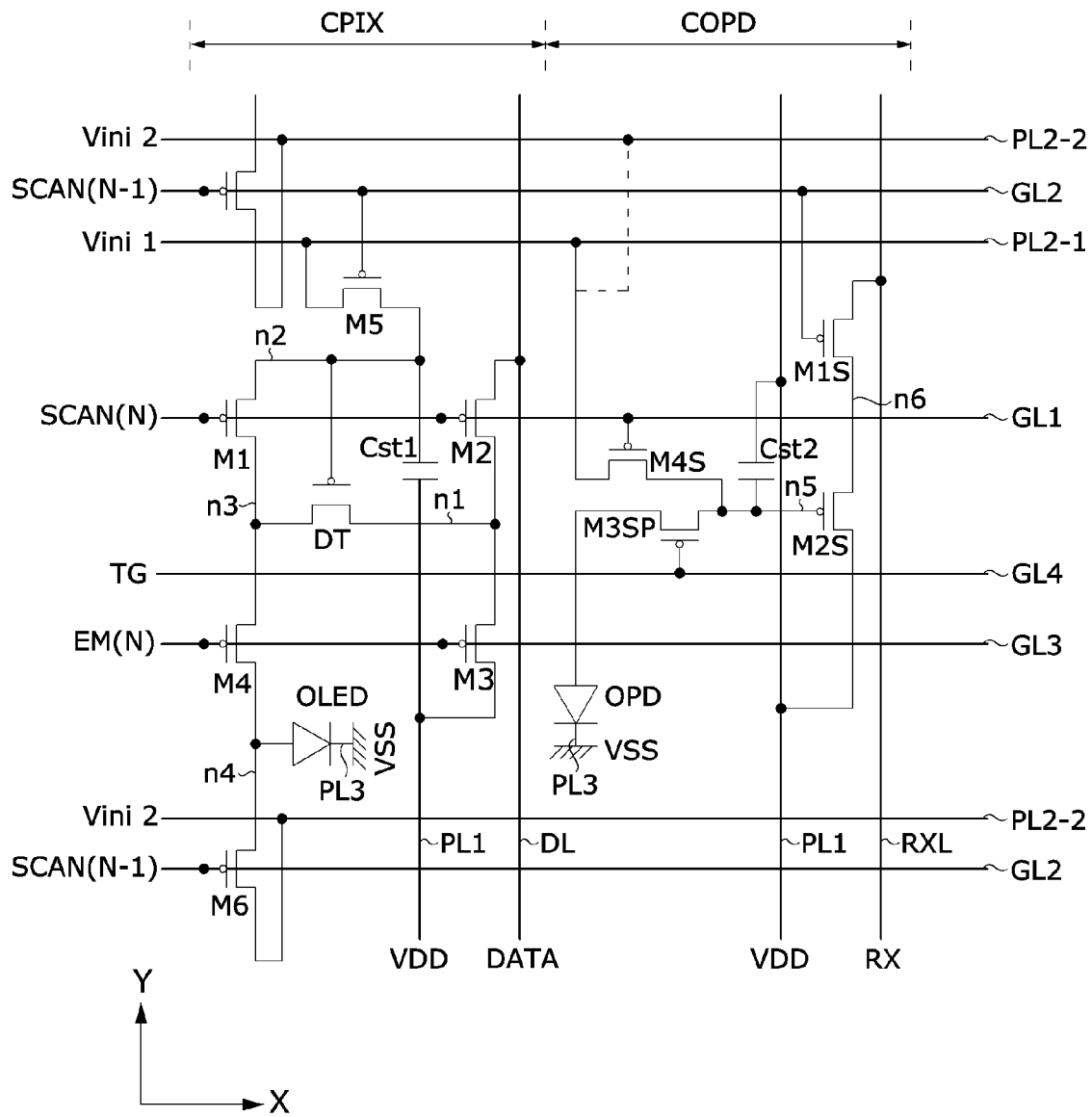
FIG. 19 is a circuit diagram illustrating a pixel circuit and a photosensor drive circuit according to a third embodiment of the present disclosure according to an embodiment of the present disclosure.

FIG. 19 is a circuit diagram illustrating a pixel circuit and a photosensor drive circuit according to a third embodiment of the present disclosure. In FIG. 19, components which are substantially the same as those of the above-described embodiments are assigned to the same reference numerals, and detailed descriptions thereof will be omitted herein.

Referring to FIG. 19, the initialization voltage may be divided into a first initialization voltage Vini1 for initializing the driving element DT of the pixel circuit CPIX and a second initialization voltage Vini2 for initializing the light-emitting element OLED of the pixel circuit CPIX. The first initialization voltage Vini1 may be used as an initialization voltage of a second node n2 connected to a gate electrode of the driving element DT. The second initialization voltage Vini2 may be used as an initialization voltage of an anode electrode of the light-emitting element OLED, that is, a fourth node n4. When the second initialization voltage Vini2 is separated from the first initialization voltage Vini1, since the second initialization voltage Vini2 may be set to a voltage different from the first initialization voltage Vini1, it is effective in preventing or at least reducing spots caused by low gradation in which a low current flows in the light-emitting element OLED.

A fifth switching element M5 is turned on in response to a gate-on voltage VGL of a $(N-1)^{th}$ scan pulse SCAN(N-1) to connect the second node n2 to a second-first Vini line PL2-1 to which the first initialization voltage Vini1 is applied. A gate electrode of the fifth switching element M5 is connected to the second gate line GL2 to receive the $(N-1)^{th}$ scan pulse SCAN(N-1). A first electrode of the fifth switching element M5 is connected to the second node n2, and a second electrode thereof is connected to the second-first Vini line PL2-1. A gate voltage of the driving element DT and the capacitor Cst1 are initialized due to the first initialization voltage Vini1.

A sixth switching element M6 is turned on in response to the gate-on voltage VGL of an $N^{th}$ scan pulse SCAN(N) or the $(N-1)^{th}$ scan pulse SCAN(N-1) to connect the fourth node n4 to a second-second Vini line PL2-2 to which the second initialization voltage Vini2 is applied. A gate electrode of the sixth switching element M6 is connected to the gate line GL1 or GL2 to which the $N^{th}$ scan pulse SCAN(N) or the $(N-1)^{th}$ scan pulse SCAN(N-1) is applied. A first electrode of the sixth switching element M6 is connected to the second-second Vini line PL2-2, and a second electrode thereof is connected to the fourth node n4. An anode voltage of the light-emitting element OLED is initialized due to the second initialization voltage Vini2.

The photosensor drive circuit COPD may be initialized at the first initialization voltage Vini1 or the second initialization voltage Vini2 In FIG. 19, an example in which the first initialization voltage Vini1 is applied to the photosensor drive circuit COPD is illustrated, but it should be noted that the present disclosure is not limited thereto.

In response to the $N^{th}$ scan pulse SCAN(N), a fourth-S switching element M4S of the photosensor drive circuit COPD may initialize a fifth node n5. The fourth-S switching element M4S includes a gate electrode connected to the first gate line GL1 to which the $N^{th}$ scan pulse SCAN(N) is applied, a first electrode connected to the second-first Vini line PL2-1 to which the initialization voltage Vini is applied or connected to the second-second Vini line PL2-2 to which the second initialization voltage Vini2 is applied, and a second electrode connected to the fifth node n5.

FIG. 20 is a detailed plan view illustrating layouts of the pixel circuit and the photosensor drive circuit according to one embodiment. FIGS. 21A to 21G are plan views illustrating a pattern shape of each layer by separating main layers from the layouts of the pixel circuit and the photosensor drive circuit which are shown in FIG. 20 according to one embodiment.

As can be seen from FIGS. 20 to 21G, the first gate line GL1, the second gate line GL2, and the third gate line GL3 may be disposed parallel to each other on a first plane above an active pattern. The gate lines GL1, GL2, and GL3 disposed on the first plane intersect the data line DL, the VDD line PL1, and the RX line RXL. The Vini lines PL2-1 and PL2-2 and the fourth gate line GL4 may be disposed parallel to each other on a second plane above the first plane. The data line DL and the VDD line PL1 may be disposed parallel to each other on a third plane above the second plane. The RX line RXL and the VDD line PL1 may be disposed parallel to each other on a fourth plane above the third plane. The VDD lines PL1 disposed on the second and third planes are connected to each other to receive the same pixel driving voltage VDD.

A first metal layer M01 may be patterned in a shape as shown in FIG. 21A. The first metal layer M01 may include an optical shield pattern BSM overlapping an active pattern of the DT in the pixel circuit CPIX. An active layer ACT may be patterned in a shape as shown in FIG. 21B. The active layer ACT includes active patterns A01 to A04 of TFTs in the pixel circuit CPIX and the photosensor drive circuit COPD. Some of the active patterns A01 to A04 may be metallized. A fourth active pattern A04 may be connected to a second capacitor Cst2.

The second metal layer M02 may be patterned in a shape as shown in FIG. 21C. The second metal layer M02 may include the gate lines GL1, GL2, GL3 to which scan pulses and EM pulses are applied, a gate electrode of the TFT, a lower electrode M02c of a first storage capacitor Cst1, and a jumper pattern M02d. A gate pattern M02a is a gate electrode pattern of a second-S switching element M2S. A gate pattern M02b is gate electrode patterns of a third-S switching elements M3SP and M3SN. The jumper pattern M02d is used to connect the metal layers through a contact hole. In each of the metal layers, the jumper pattern connects electrodes of the TFTs to main nodes.

A third metal layer M03 may be patterned in a shape as shown in FIG. 21D. The third metal layer M03 may include an upper electrode M03b of the first capacitor Cst1, a lower electrode M03c of the second capacitor Cst2, the Vini lines PL2-1 and PL2-2, the fourth gate line GL4, and a jumper pattern M03a. An exposure signal TG of the photosensor drive circuit COPD may be applied to the fourth gate line GL4. In the examples of FIGS. 14 and 16, one Vini line of the Vini lines PL2-1 and PL2-2 may be omitted.

A fourth metal layer M04 may be patterned in a shape as shown in FIG. 21E. The fourth metal layer M04 may include the VDD line PL1, the data line DL, and jumper patterns M04a to M04i. An upper electrode of the second capacitor Cst2 may be integrated with the VDD line PL1 of the fourth metal layer M04.

A fifth metal layer M05 may be patterned in a shape as shown in FIG. 21F. The fifth metal layer M05 may include the VDD line PL1, the RX line RXL, and jumper patterns M05a and M05b. Anode electrodes AND of the pixel circuit CPIX and the photosensor drive circuit COPD may be patterned in shapes as shown in FIG. 21G. Thus, the anode electrode AND of the pixel circuit CPIX is formed to be coplanar with the anode electrode AND of the photosensor drive circuit COPD.

Figure 22:
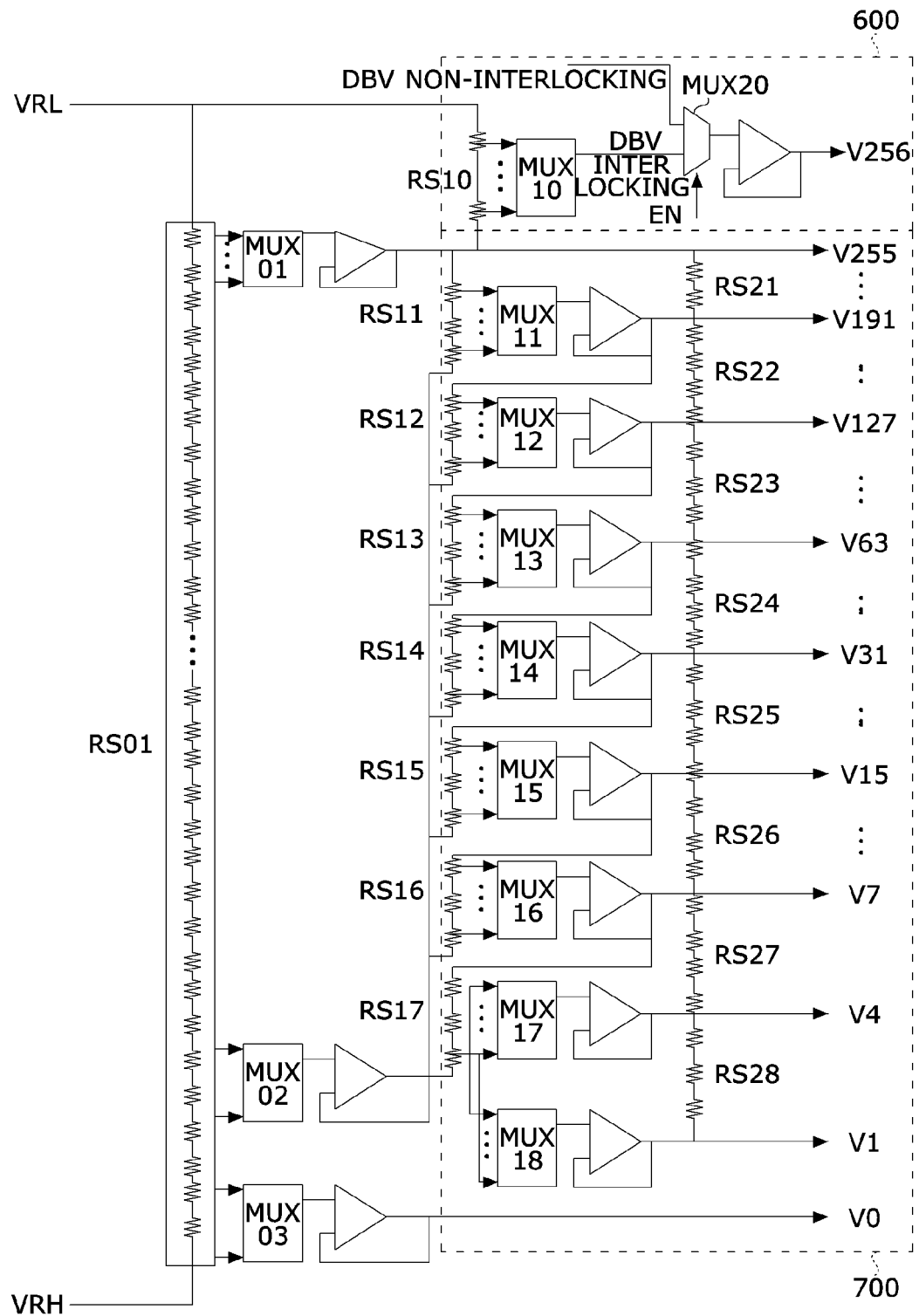
FIG. 22 is a circuit diagram illustrating a gamma compensation voltage generator according to one embodiment of the present disclosure.

FIG. 22 is a circuit diagram illustrating the gamma compensation voltage generator 305 according to one embodiment of the present disclosure.

Referring to FIG. 22, the gamma compensation voltage generator 305 receives a high potential input reference voltage VRH and a low potential input reference voltage VRL from a power supply 304 and outputs a gamma compensation voltage (or a display driving voltage) for each gradation for display driving and outputs a light source driving voltage. When the driving element DT of the pixel circuit CPIX is driven as a p-channel TFT, as the gate voltage is decreased, an amount of a current is increased, and thus as a gamma compensation voltage output from the gamma compensation voltage generator 305 is decreased, the pixel and the light-emitting device OLED of the sensing light source may emit light at a high brightness.

The gamma compensation voltage generator 305 includes an input voltage selector, a gradation voltage generator 700 for generating a gamma compensation voltage for display driving, and a light source driving voltage generator 600.

The gamma compensation voltage generator 305 includes a plurality of voltage divider circuits and a plurality of multiplexers. The voltage divider circuit divides a voltage between a high-potential voltage and a low-potential voltage using resistors connected in series and outputs voltages having different voltage levels. Each of the multiplexers selects a voltage indicated by a resistor setting value from among the voltages divided by the voltage divider circuit. The timing controller 303 may input resistor setting values in the display mode and the fingerprint recognition mode, to control terminals of the multiplexers and control voltage levels of output voltages V0 to V256 of the gamma compensation voltage generator 305 for each mode. The resistor setting value may be defined and updated by resistor setting data stored in the second memory 302.

The input voltage selector includes a voltage divider circuit RS01, a multiplexer MUX01 for selecting a highest gradation voltage V255 according to a setting value of a first resistor, a multiplexer MUX02 for selecting lower gamma compensation voltages according to a setting value of a second resistor, and a multiplexer MUX03 for outputting a lowest gamma compensation voltage V0 according to a setting value of a third resistor. The voltage V255 output from the multiplexer MUX01 is supplied to the voltage divider circuits of the gradation voltage generator 700 and the light source driving voltage generator 600. The voltage output from the multiplexer MUX01 is supplied to the voltage divider circuits of the gradation voltage generator 700.

The light source driving voltage generator 600 includes a tenth voltage divider circuit RS10 and multiplexers MUX10 and MUX20, which are connected between a VRL node and a V255 node. The voltage divider circuit RS10 divides voltages between the low potential input reference voltage VRL and the highest gradation voltage V255. The output voltages of the voltage divider circuit RS10 have voltage levels that are higher than a voltage level of the highest gradation voltage V255. The multiplexer MUX10 selects any one among the voltages divided by the voltage divider circuit RS10 according to a setting value of a fourth resistor and outputs a light source driving voltage (a display brightness value (DBV) linking voltage) which is varied according to a DBV. The DBV is brightness setting data for varying a brightness according to an output signal of an illumination sensor of the host system 200 or a brightness input value of a user. A resistor setting value, which controls each multiplexer, may be varied according to the DBV. The output voltages of the multiplexer MUX10 may be selected from a gradation voltage range that is higher than the highest gradation voltage V255.

In the fingerprint recognition mode, since the display pixels in the first sensing area SA are driven as light sources, the display pixels may emit light at a brightness that is higher than a brightness of display area DA. In this case, the data voltage applied to the display pixels in the first sensing area SA in the fingerprint recognition mode may be applied as a light source driving voltage V256 having a gradation that is higher than the highest gradation voltage V255 of the display mode.

The multiplexer MUX20 selects any one of a separate reference voltage (DBV non-linking voltage), which is independently set from the DBV, and the DBV linking voltage output from the multiplexer MUX10 under the control of the host system 200 and outputs the light source driving voltage V256. The DBV non-linking voltage is a gradation voltage that is higher than the highest gradation voltage V255. In the fingerprint recognition mode, the host system 200 may control the output voltage of the multiplexer MUX20 using an enable signal EN. Thus, the DBF linking voltage or the DBV non-linking voltage, which is output from the multiplexer MUX20, is the light source driving voltage V256 that is higher than the highest gradation voltage V255.

The gradation voltage generator 700 includes a plurality of voltage divider circuits RS11 to RS17 and a plurality of multiplexers MUX11 to MUX18.

A first-first voltage divider circuit RS11 divides a voltage between an output voltage of the first multiplexer MUX01 and an output voltage of the second multiplexer MUX02. The first-first multiplexer MUX11 selects any one among voltages divided by the voltage divider circuit RS11 according to a resistor setting value. The output voltage of the first-first multiplexer MUX11 may be output through a buffer and may be a voltage V191 of 191 gradations. A first-second voltage divider circuit RS12 divides a voltage between an output voltage of the first-first multiplexer MUX11 and an output voltage of the second multiplexer MUX02. The first-second multiplexer MUX12 selects any one among voltages divided by the voltage divider circuit RS12 according to a resistor setting value. The output voltage of the first-second multiplexer MUX12 may be output through a buffer and may be a voltage V127 of 127 gradations.

A first-third voltage divider circuit RS13 divides a voltage between an output voltage of the first-second multiplexer MUX12 and an output voltage of the second multiplexer MUX02. The first-third multiplexer MUX13 selects any one among voltages divided by the voltage divider circuit RS13 according to a resistor setting value. The output voltage of the first-third multiplexer MUX13 may be output through a buffer and may be a voltage V63 of 63 gradations. A first-fourth voltage divider circuit RS14 divides a voltage between an output voltage of the first-third multiplexer MUX13 and an output voltage of the second multiplexer MUX02. The first-fourth multiplexer MUX14 selects any one among voltages divided by the voltage divider circuit RS14 according to a resistor setting value. The output voltage of the first-fourth multiplexer MUX14 may be output through a buffer and may be a voltage V31 of 31 gradations.

A first-fifth voltage divider circuit RS15 divides a voltage between an output voltage of the first-fourth multiplexer MUX14 and an output voltage of the second multiplexer MUX02. The first-fifth multiplexer MUX15 selects any one among voltages divided by the voltage divider circuit RS15 according to a resistor setting value. The output voltage of the first-fifth multiplexer MUX15 may be output through a buffer and may be a voltage V15 of 15 gradations. A first-sixth voltage divider circuit RS16 divides a voltage between an output voltage of the first-fifth multiplexer MUX15 and an output voltage of the second multiplexer MUX02. The first-sixth multiplexer MUX16 selects any one among voltages divided by the voltage divider circuit RS16 according to a resistor setting value. The output voltage of the first-sixth multiplexer MUX16 may be output through a buffer and may be a voltage V7 of 7 gradations.

A first-seventh voltage divider circuit RS17 divides a voltage between an output voltage of the first-sixth multiplexer MUX16 and an output voltage of the second multiplexer MUX02. The first-seventh multiplexer MUX17 selects any one among voltages divided by the voltage divider circuit RS17 according to a resistor setting value. The output voltage of the first-seventh multiplexer MUX17 may be output through a buffer and may be a voltage V4 of 4 gradations. The first-eighth voltage divider circuit RS17 divides a voltage between the highest gradation voltage and the lowest gradation voltage among voltages divided by the first-seventh voltage divider circuit RS17. The first-eighth multiplexer MUX18 selects any one among voltages divided by the voltage divider circuit RS17 according to a resistor setting value. The output voltage of the first-eighth multiplexer MUX18 may be output through a buffer and may be a voltage V1 of 1 gradation.

The gradation voltage generator 700 further includes a plurality of voltage divider circuits RS21 to RS28. The second-first voltage divider circuit RS21 divides a voltage between the highest gamma compensation voltage V255 and the voltage V191 of 191 gradations to output a gamma compensation voltage between the highest gradation and the 191 gradations. The second-second voltage divider circuit RS22 divides a voltage between the voltage V191 of 191 gradations and the voltage V127 of 127 gradations to output a gamma compensation voltage between the 191 gradations and the 127 gradations. The second-third voltage divider circuit RS23 divides a voltage between the voltage V127 of 127 gradations and the voltage V63 of 63 gradations to output a gamma compensation voltage between the 127 gradations and the 63 gradations. The second-fourth voltage divider circuit RS24 divides a voltage between the voltage V63 of 63 gradations and the voltage V31 of 31 gradations to output a gamma compensation voltage between the 63 gradations and the 31 gradations. The second-fifth voltage divider circuit RS25 divides a voltage between the voltage V31 of 31 gradations and the voltage V15 of 15 gradations to output a gamma compensation voltage between the 31 gradations and the 15 gradations. The second-sixth voltage divider circuit RS26 divides a voltage between the voltage V15 of 15 gradations and the voltage V7 of 7 gradations to output a gamma compensation voltage between the 15 gradations and the 7 gradations. The second-seventh voltage divider circuit RS27 divides a voltage between the voltage V7 of 7 gradations and the voltage V4 of 4 gradations to output a gamma compensation voltage between the 7 gradations and the 4 gradations. The second-eighth voltage divider circuit RS28 divides a voltage between the voltage V4 of 4 gradations and the voltage V1 of 1 gradations to output a gamma compensation voltage between the 4 gradations and the 1 gradations.

In order to output an optimal gamma compensation voltage for the sub-pixels for each color, the gamma compensation voltage generator 305 may include an R gamma compensation voltage generator, a G gamma compensation voltage generator, and a B gamma compensation voltage generator. In this case, resistor setting values may be set to different voltages in the R gamma compensation voltage generator, the G gamma compensation voltage generator, and the B gamma compensation voltage generator. Gamma compensation voltages output from the R gamma compensation voltage generator are data voltages of gradations to be supplied to the R sub-pixel. Gamma compensation voltages output from the G gamma compensation voltage generator are data voltages of gradations to be supplied to the G sub-pixel. Gamma compensation voltages output from the B gamma compensation voltage generator are data voltages of gradations to be supplied to the B sub-pixel.

The gamma compensation voltages V0 to V255 of gradations and the light source driving voltage V256 are input to the DAC of the data driver 306. The DAC of the data driver 306 converts the pixel data received from the timing controller 303 into different gamma compensation voltages for each gradation to generate the data voltage Vdata for display driving. In the fingerprint recognition mode, the data driver 306 converts the light source driving data received from the timing controller 303 into the light source driving voltage V256 and supplies the light source driving voltage V256 to the display pixels R, G and B in the first sensing area SA, which are used as light sources, through the data lines.

Since the PPI of each of the first and second sensing area SA is lower than the PPI of the display area DA, when the display pixels in the display area DA and the display pixels in the first sensing area SA are driven at the same data voltage in the same gradation, brightness of the first and second sensing area SA may be decreased. According to the present disclosure, the resistor setting value of the gamma compensation voltage generator 305 is varied in the fingerprint sensing mode, and thus a dynamic range of the data voltage applied to the display pixels of the first sensing area SA is extended in the fingerprint sensing mode so that the brightness of the pixels may be increased in the first and second sensing area SA.

Figure 23:
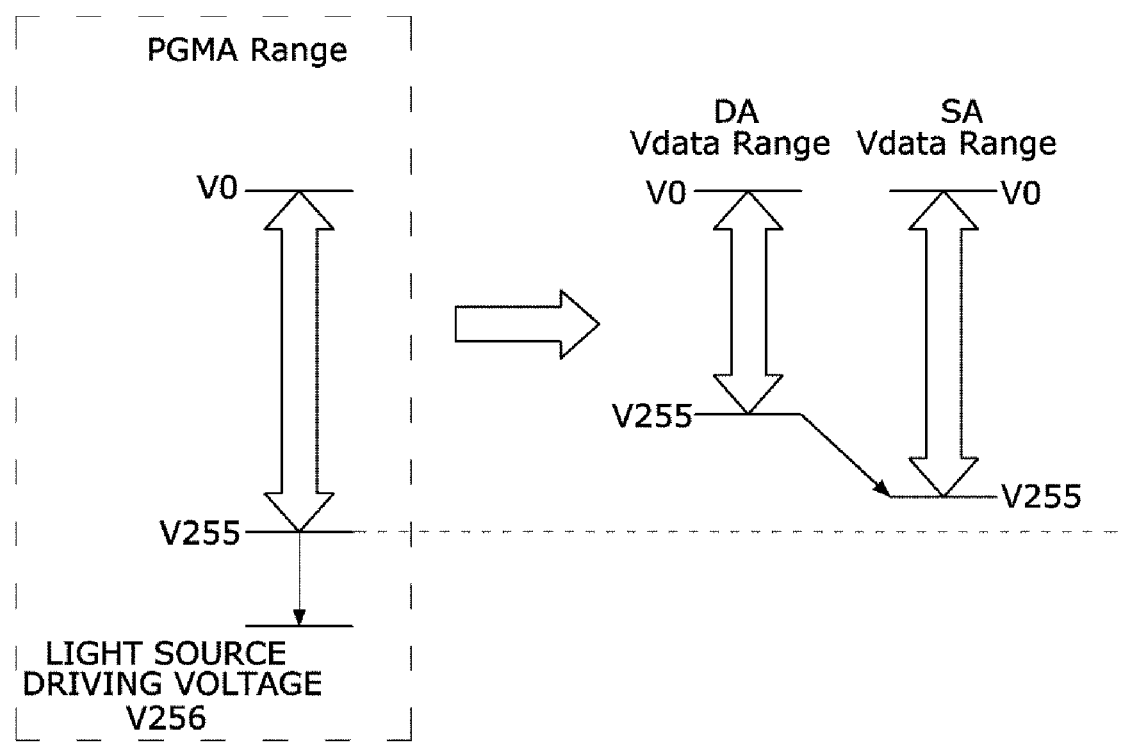
FIG. 23 is a diagram illustrating data voltages applied to pixels in a display area and data voltages applied to pixels in a sensing area according to an embodiment of the present disclosure.

FIG. 23 is a diagram illustrating data voltages applied to the display pixels R, G, and B in the display area DA and data voltages applied to the pixels in the sensing area according to one embodiment. In FIG. 23, a "PGMA Range" indicates an output voltage range of the gamma compensation voltage generator 305.

Referring to FIG. 23, the output voltage range of the data driver 306 may be set differently in the display area DA and the sensing area SA. Since the PPI of the sensing area SA is low, a voltage range of the data voltage Vdata applied to the pixels of the sensing area SA is extended when compared with a range of the data voltage Vdata applied to the pixels of the display area DA.

In accordance with the present disclosure, the sensor pixels for fingerprint sensing are embedded in a display panel together with the display pixels. In accordance with the present disclosure, a pixel drive circuit and a photosensor drive circuit share power lines and signal lines, and electrodes of a light-emitting element and a photodiode are disposed on the same layer so that a structure of the display panel can be simplified.

In accordance with the present disclosure, when the display pixels and the sensor pixels are simultaneously driven, the sensor pixels can be driven without affecting driving of the display pixels connected to the sensor pixels.

Effects which can be achieved by the present disclosure are not limited to the above-mentioned effects. That is, other objects that are not mentioned may be obviously understood by those skilled in the art to which the present disclosure pertains from the following description.

It will be apparent to those skilled in the art that various modifications can be made to the above-described exemplary embodiments of the present disclosure without departing from the spirit or scope of the disclosure. Thus, it is intended that the present disclosure covers all such modifications provided they come within the scope of the appended claims and their equivalents.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a display panel including a screen in which a plurality of display pixels are sequentially scanned, and a plurality of sensor pixels that are exposed to a light during an exposure time to convert the light into an electric current,
wherein the plurality of display pixels include a first plurality of display pixels and a second plurality of display pixels, the first plurality of display pixels disposed in a plurality of first pixel rows that lack any sensor pixels in a first area of the screen, and the second plurality of display pixels and the plurality of sensor pixels disposed in a plurality of second pixel rows in a second area of the screen that is different from the first area of the screen,
wherein, while the plurality of display pixels disposed in the first area of the screen are scanned, the plurality of sensor pixels are exposed, and
while the plurality of display pixels in the second area of the screen are scanned, sensor data is output from the plurality of sensor pixels and then the plurality of sensor pixels are initialized.

2. The display device of claim 1, wherein a low potential power voltage and a pixel driving voltage are applied to a pixel circuit driving the plurality of display pixels and a photosensor drive circuit driving the plurality of sensor pixels.

3. The display device of claim 2, wherein a cathode electrode of a light-emitting element of a display pixel from the plurality of display pixels and a cathode electrode of a photodiode of a sensor pixel from the plurality of sensor pixels share a same metal electrode.

4. The display device of claim 2, wherein an anode electrode of a light-emitting element of a display pixel from the plurality of display pixels and an anode electrode of a photodiode of a sensor pixel from the plurality of sensor pixels are formed on a same layer and include metal patterns separated from each other.

5. The display device of claim 1, wherein a photodiode of a sensor pixel from the plurality of sensor pixels includes an organic photodiode.

6. The display device of claim 2, wherein the pixel circuit includes:
a driving element configured to drive a light-emitting element of a display pixel from the plurality of display pixels;
a first capacitor configured to maintain a gate voltage of the driving element; and
a switching circuit connected to a first power line to which a pixel driving voltage is applied, a second power line to which an initialization voltage is applied, a third power line to which a low potential power voltage is applied, a data line to which a data voltage is applied, a first gate line to which a first scan pulse of a gate-on voltage is applied, a second gate line to which a second scan pulse generated as the gate-on voltage is applied prior to the first scan pulse, and a third gate line to which an EM pulse generated as a gate-off voltage is applied and configured to switch voltages applied to the driving element and the light-emitting element.

7. The display device of claim 6, wherein the photosensor drive circuit includes:
a second capacitor; and
a switching circuit connected to a photodiode of a sensor pixel from the plurality of sensor pixels, the second capacitor, the first power line, the second power line, the third power line, the first gate line, the second gate line, a fourth gate line to which a pulse of an exposure signal is applied, and a first line through which the sensor data is transmitted.

8. The display device of claim 7, wherein the pixel circuit and the photosensor drive circuit are initialized due to the initialization voltage.

9. The display device of claim 7, wherein:
the driving element includes a first electrode connected to a first node, a gate connected to a second node, and a second electrode connected to a third node;
an anode of the light-emitting element is connected to a fourth node, and a cathode of the light-emitting element is connected to the third power line;
the first capacitor is connected between the first power line and the first node; and
the switching circuit of the pixel circuit includes:
a first switching element including a gate electrode connected to the first gate line, a first electrode connected to the second node, and a second electrode connected to the third node;
a second switching element including a gate electrode connected to the first gate line, a first electrode connected to the first node, and a second electrode connected to the data line;
a third switching element including a gate electrode connected to the third gate line, a first electrode connected to the first power line, and a second electrode connected to the first node;
a fourth switching element including a gate electrode connected to the third gate line, a first electrode connected to the third node, and a second electrode connected to the fourth node;
a fifth switching element including a gate electrode connected to the second gate line, a first electrode connected to the second node, and a second electrode connected to the second power line; and
a sixth switching element including a gate electrode connected to the first gate line or the second gate line, a first electrode connected to the second power line, and a second electrode connected to the fourth node.

10. The display device of claim 9, wherein:
the second capacitor is connected between a fifth node and the first power line;
the switching circuit of the photosensor drive circuit includes:
a first-S switching element including a gate electrode connected to the second gate line, a first electrode connected to the first line, and a second electrode connected to a sixth node;

a second-S switching element including a gate electrode connected to the fifth node, a first electrode connected to the sixth node, and a second electrode connected to the first power line;

a third-S switching element including a gate electrode connected to the fourth gate line, a first electrode connected to an anode electrode of the photodiode, and a second electrode connected to the fifth node; and a fourth-S switching element including a gate electrode connected to the first gate line, a first electrode connected to the second power line, and a second electrode connected to the fifth node; and a cathode electrode of the photodiode is connected to the third power line.

11. The display device of claim 10, wherein:

the exposure signal is generated as the gate-on voltage during the exposure time of the sensor pixel, and the exposure signal is generated as the gate-off voltage during the output time and initialization time of the sensor pixel;

the driving element of the pixel circuit and the first switching element to the sixth switching element of the switching circuit are turned on in response to the gate-on voltage and are turned off in response to the gate-off voltage; and the first-S switching element to the fourth-S switching element of the switching circuit of the sensor pixel are turned on in response to the gate-on voltage and are turned off in response to the gate-off voltage.

12. The display device of claim 10, wherein each of the driving element and the first switching element to the sixth switching element of the pixel circuit and each of the first-S switching element to the fourth-S switching element of the photosensor drive circuit includes a p-channel transistor.

13. The display device of claim 10, wherein:

the third-S switching element includes an n-channel transistor; and each of the first switching element to the sixth switching element of the pixel circuit and each of the first-S switching element to the fourth-S switching element of the photosensor drive circuit excluding the third-S switching element include a p-channel transistor.

14. The display device of claim 7, wherein a gate-on voltage section of the exposure signal overlaps the scan pulse generated before reaching the second area.

15. The display device of claim 10, wherein:

the initialization voltage is divided into a first initialization voltage and a second initialization voltage; and the second power line includes:

a second-first power line to which the first initialization voltage is applied; and a second-second power line to which the second initialization voltage is applied.

16. The display device of claim 15, wherein:

the second electrode of the fifth switching element is connected to the second-first power line;

the first electrode of the sixth switching element is connected to the second-second power line; and the first electrode of the fourth-S switching element is connected to the second-first power line or the second-second power line.

17. The display device of claim 7, wherein:

the first gate line, the second gate line, and the third gate line are disposed parallel to each other on a first plane on an active pattern made of a semiconductor material and intersect the data line, the first power line, and the first line;

the second power line and the fourth gate line are disposed parallel to each other on a second plane above the first plane;

the data line and the first power line are disposed parallel to each other on a third plane above the second plane; and the first line and the first power line are disposed parallel to each other on a fourth plane above the third plane.

18. A mobile terminal device comprising:

a display panel including a screen in which a plurality of display pixels are sequentially scanned, and a plurality of sensor pixels that are exposed to a light during an exposure time to convert the light into an electric current; and a fingerprint recognition processor configured to generate fingerprint pattern image data from sensor data output from the plurality of sensor pixels, wherein the plurality of display pixels include a first plurality of display pixels and a second plurality of display pixels, the first plurality of display pixels disposed in a plurality of first pixel rows that lack any sensor pixels in a first area of the screen and the second plurality of display pixels and the plurality of sensor pixels disposed in a plurality of second pixel rows in a second area of the screen that is different from the first area of the screen, wherein, while the plurality of display pixels disposed in the first area of the screen are scanned, the plurality of sensor pixels are exposed, and while the plurality of display pixels in the second area of the screen are scanned, sensor data is output from the plurality of sensor pixels and then the plurality of sensor pixels are initialized.

* * * * *